United States Patent [19]

Smith et al.

[11] 4,430,571
[45] Feb. 7, 1984

[54] METHOD AND APPARATUS FOR EXPOSING MULTI-LEVEL REGISTERED PATTERNS INTERCHANGEABLY BETWEEN STATIONS OF A MULTI-STATION ELECTRON-BEAM ARRAY LITHOGRAPHY (EBAL) SYSTEM

[75] Inventors: Donald O. Smith, Lexington; Kenneth J. Harte, Carlisle, both of Mass.

[73] Assignee: Control Data Corporation, Minneapolis, Minn.

[21] Appl. No.: 254,870

[22] Filed: Apr. 16, 1981

[51] Int. Cl.³ .......................................... H01J 37/147
[52] U.S. Cl. .............................. 250/492.2; 250/396 R; 250/491.1
[58] Field of Search ................... 250/396, 492.2, 492.3, 250/491

[56] References Cited

U.S. PATENT DOCUMENTS 3,789,185  1/1974  Baldwin et al. ................... 250/492.2

OTHER PUBLICATIONS

Lemmond et al., "Electron Fly's Eye Lens Artwork Camera," *IEEE Transactions on Electron Devices*, vol. ED-21, No. 1, Sep. 1974, 598–603.

Ahmed, "Electron-beam Lithography for Microcircuit Fabrication," *Electronics and Power*, vol. 22, No. 7, Jul. 1976, pp. 433–436.

*Primary Examiner*—Alfred E. Smith
*Assistant Examiner*—Jack I. Berman
*Attorney, Agent, or Firm*—Charles W. Helzer

[57] ABSTRACT

An electron-beam array lithography (EBAL) system and method of operation which employs an electron beam column of the array optics type having an array lens assembly, an array fine deflector assembly and a coarse deflector assembly, is described. The method and system derives fiducial marking signals from a lenslet stitching grid of fiducial elements, formed on a standard stitching target, for calibrating the boundaries of the fields of view of the respective elements of the array of lenslets. The fiducial marking signals are used to stitch together the individual fields of view of the elements in the array of lenslets. The same stitching calibration target, a precise copy, or similar precisely mapped target is used to calibrate all of the exposure stations of a multi-station EBAL system with the result that any level of multi-level registered patterns can be exposed in any of the so calibrated EBAL exposure stations.

In the event of flawed lenslets in the array lens, the locations of those parts of the exposed area which were subject to the fields of view of flawed lenslets in the array lens assembly are mapped in a computer memory and this information is used to blank the electron beam during any period that the coarse deflector might be directing the beam to a flawed lenslet. The system and method physically permutes the position of target area to a new physical position subject to the field of view of a different working lenslet. Appropriate coarse and fine deflection signals are obtained, and the electron beam then is caused to retrace over the areas previously subject to the field of view of flawed lenslets in accordance with the master pattern specifications whereby increased yield from the EBAL system is obtained.

35 Claims, 27 Drawing Figures

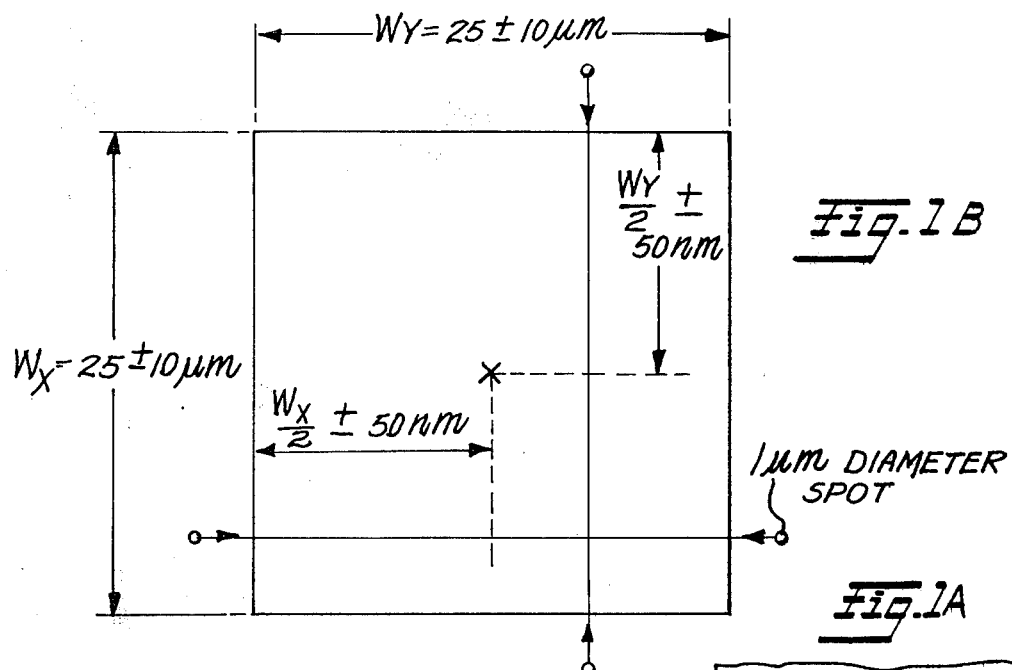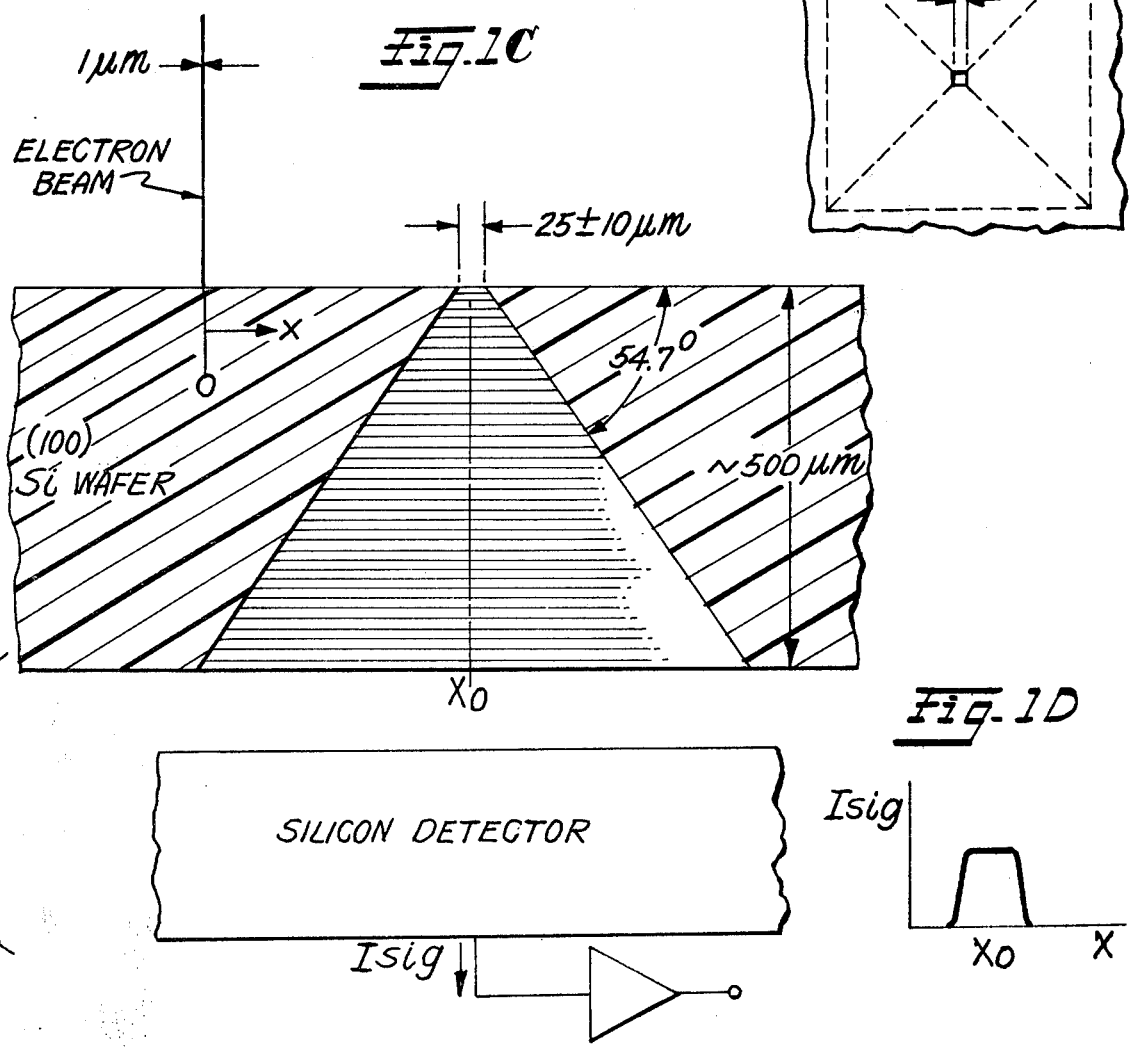

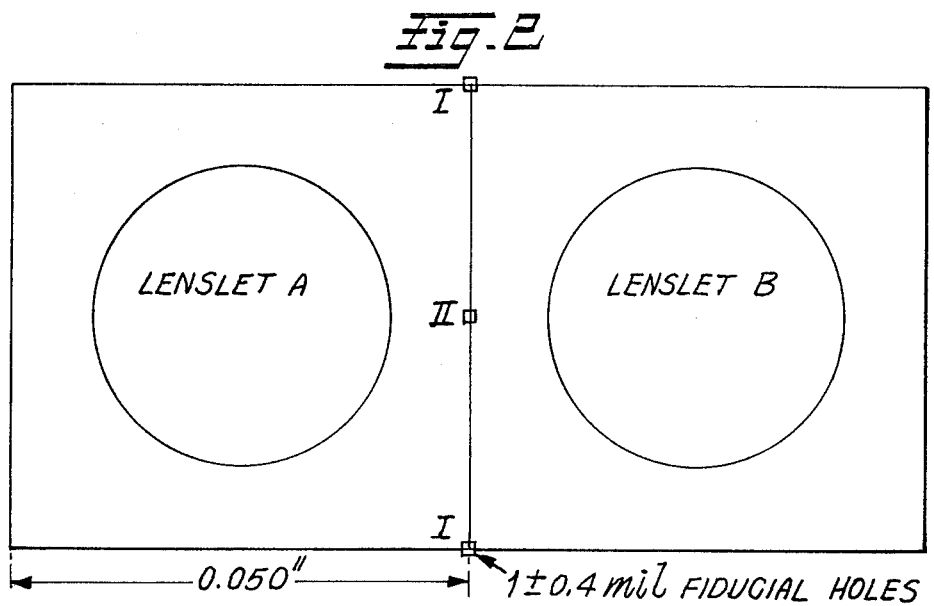
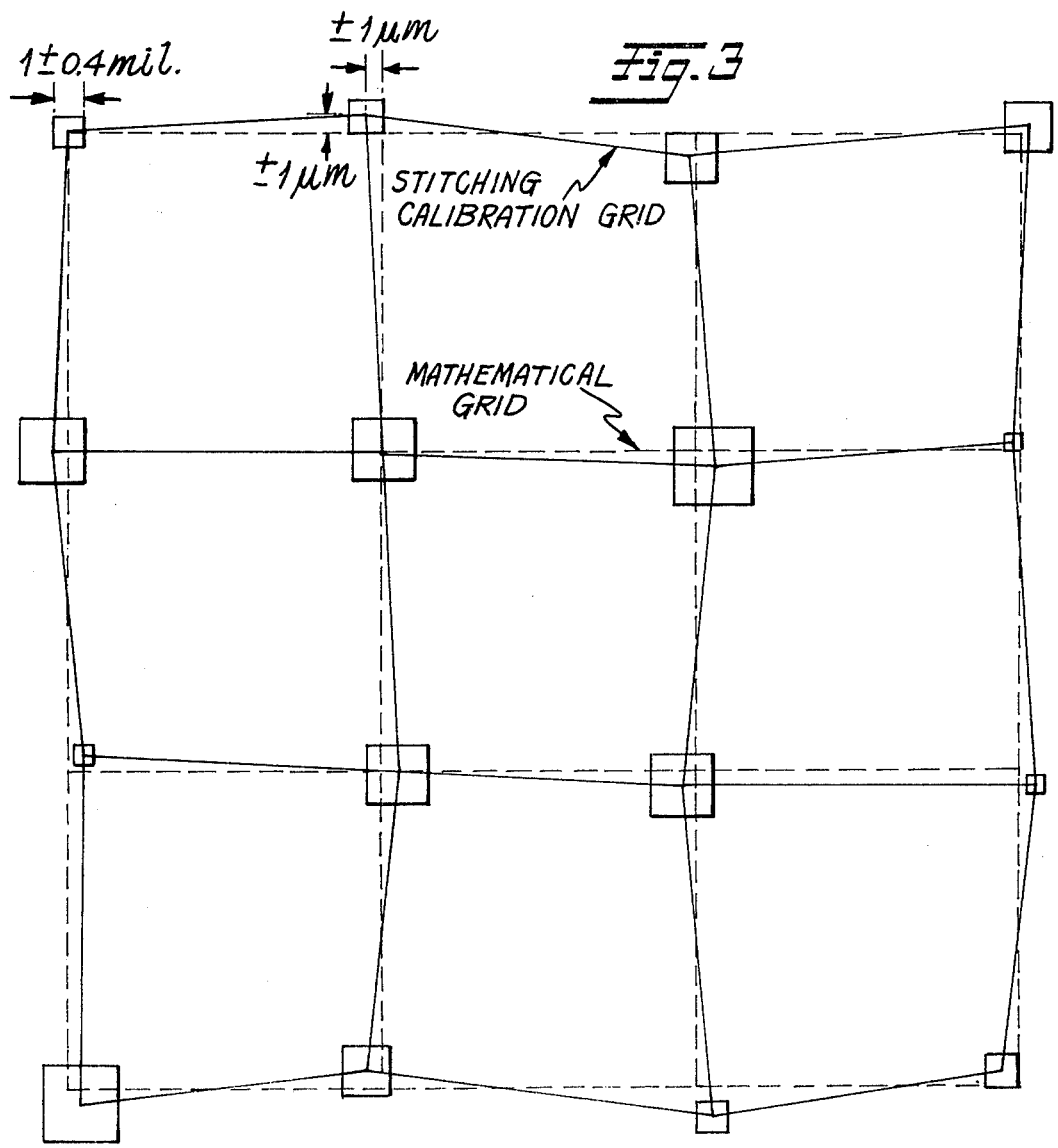

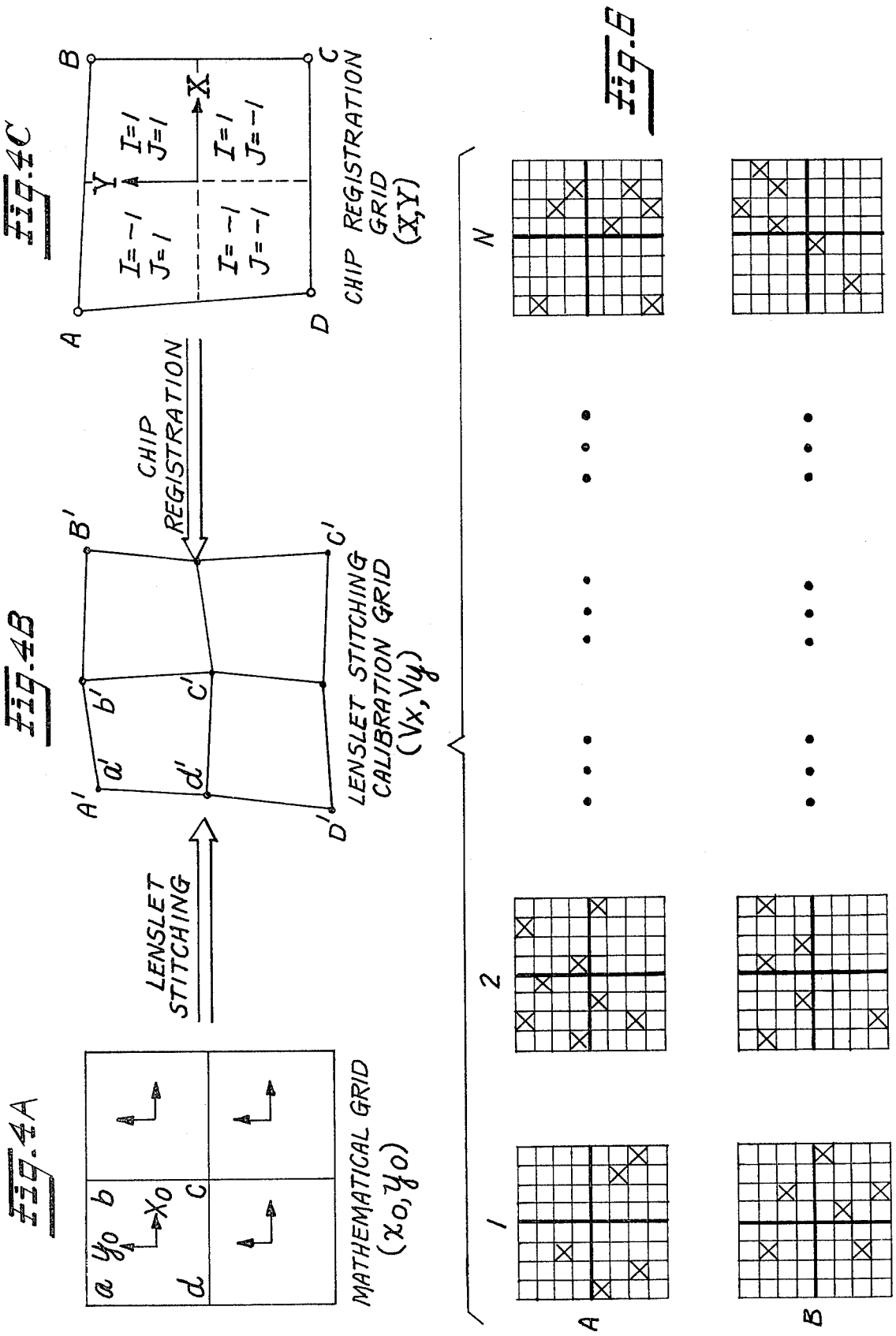

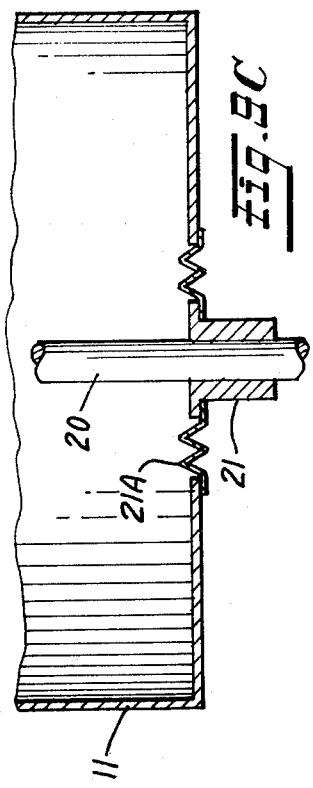
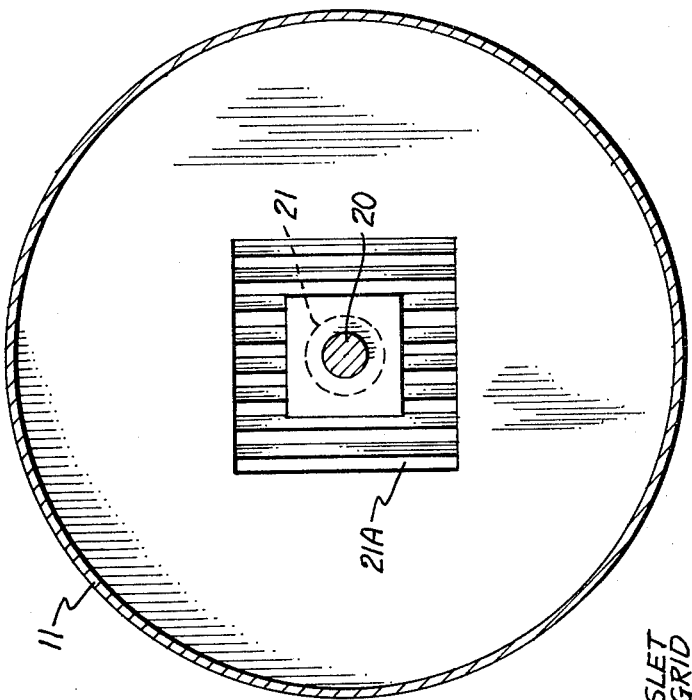
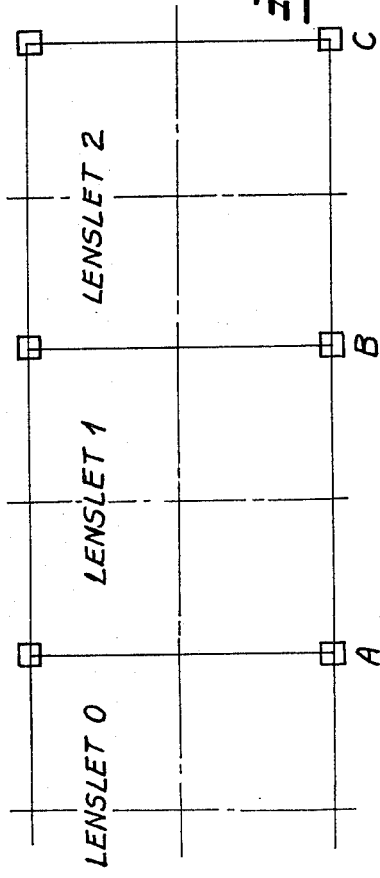
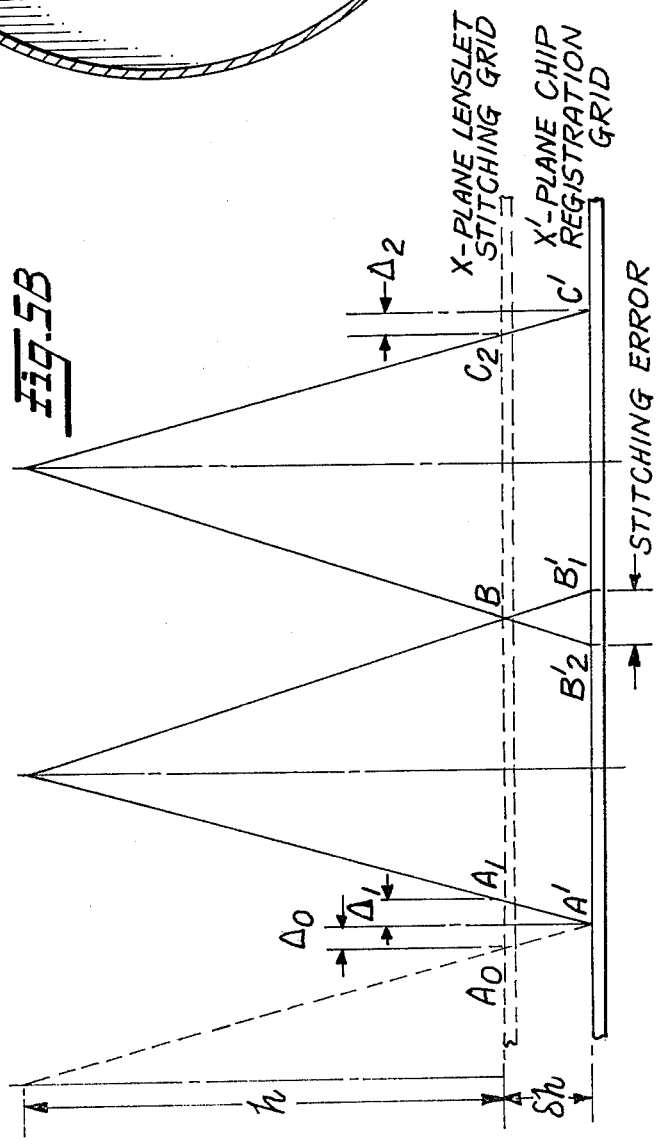

LEGEND
⊡ EFFECT OF FLAWED LENSLET FIELD ON WAFER
☐ FLAWED LENSLET FIELD
× ROTATION CENTER OF WAFER RELATIVE TO AXIS OF ELECTRON-OPTICAL COLUMN

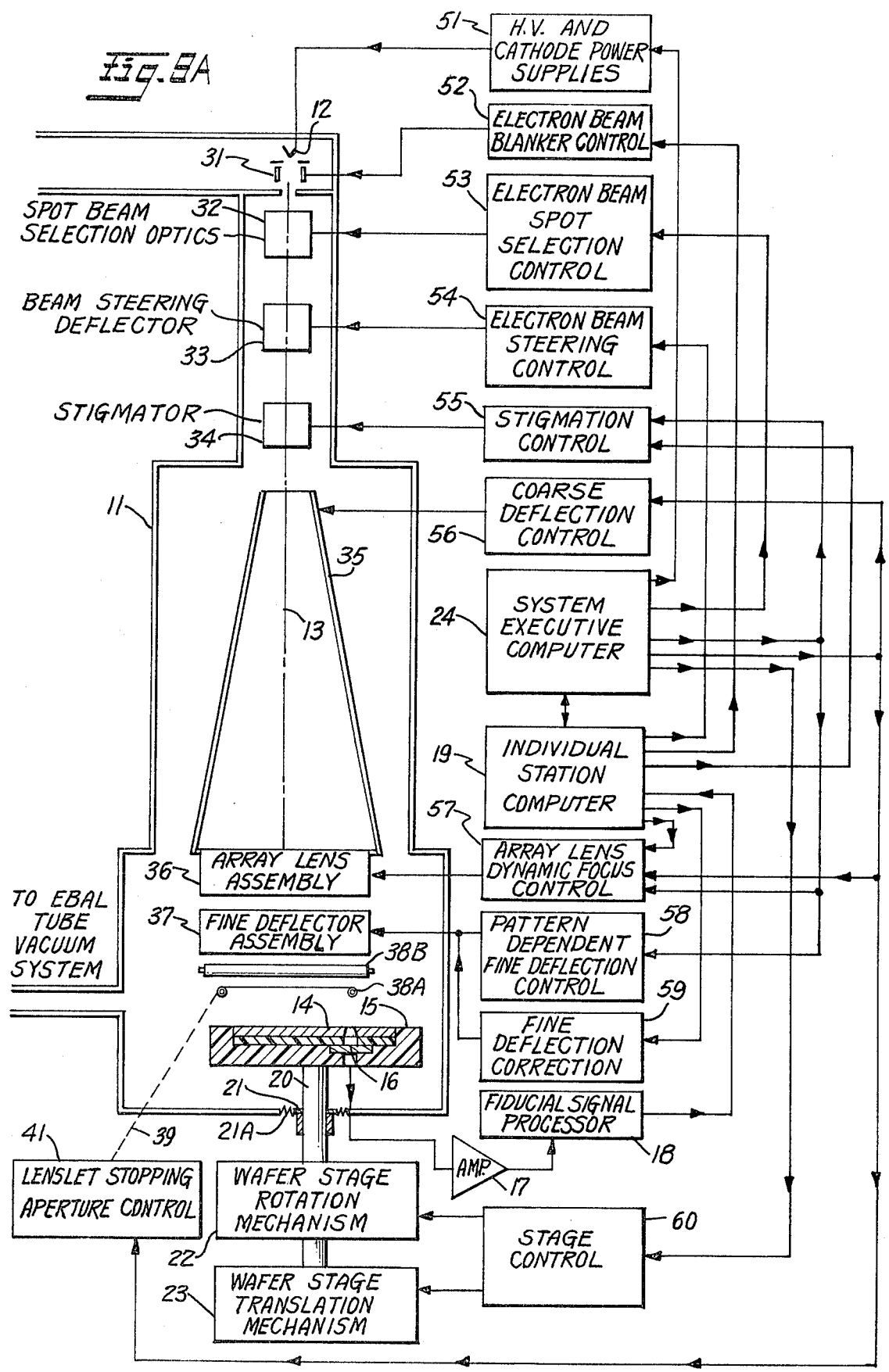

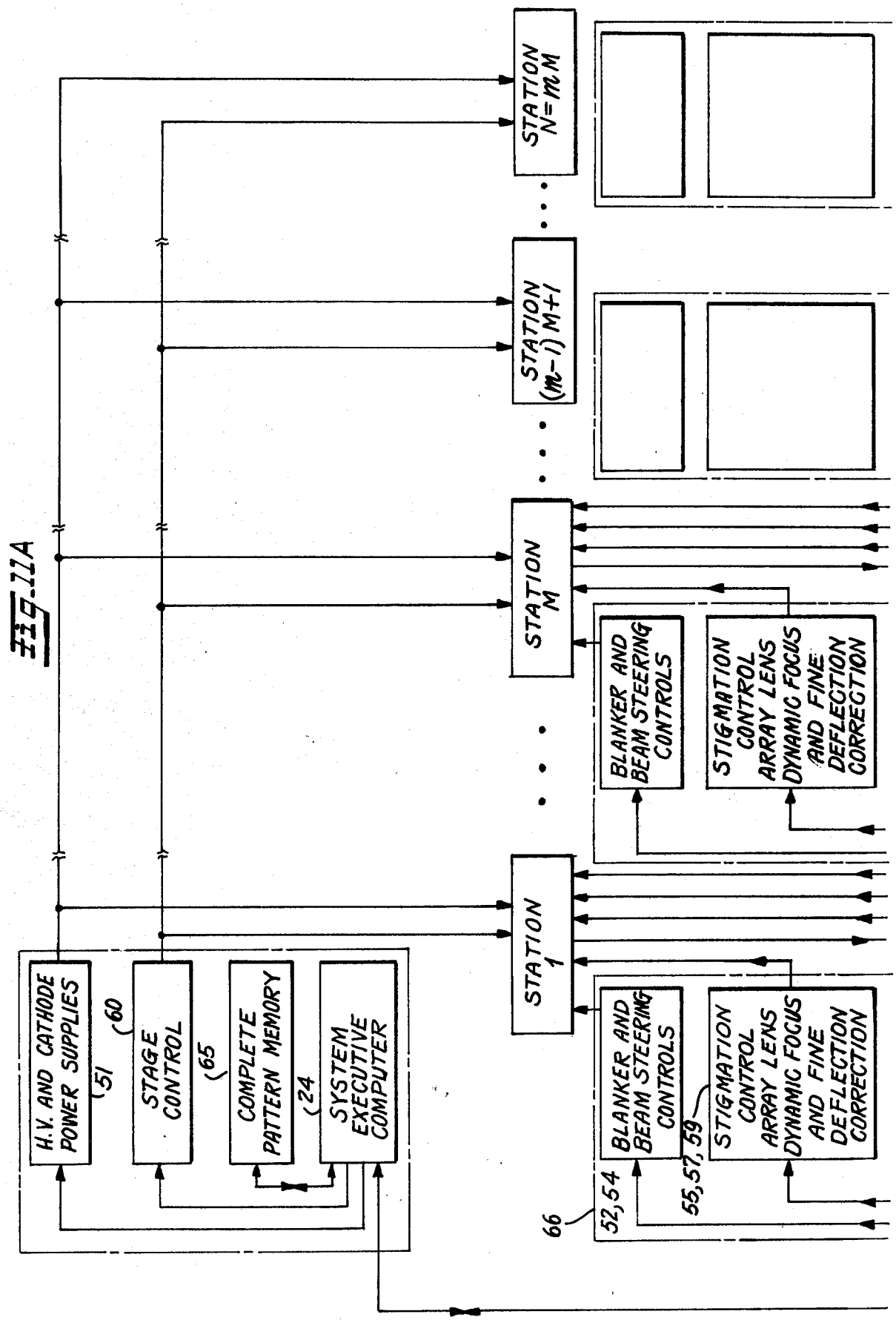

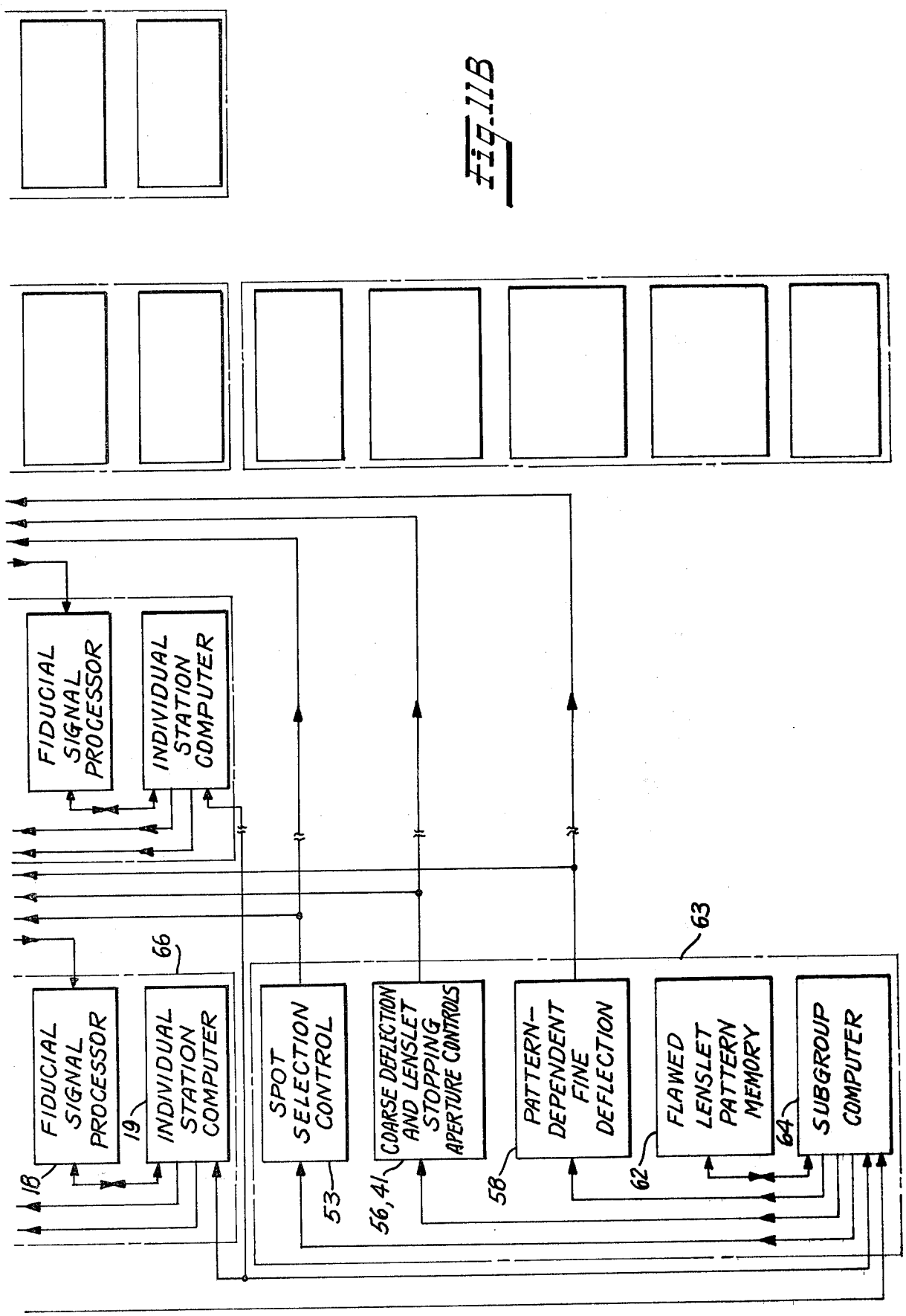

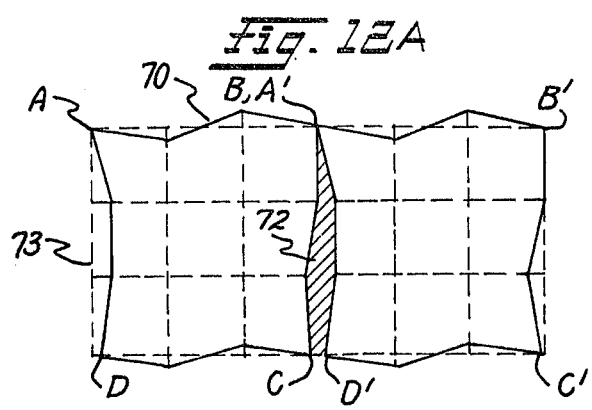
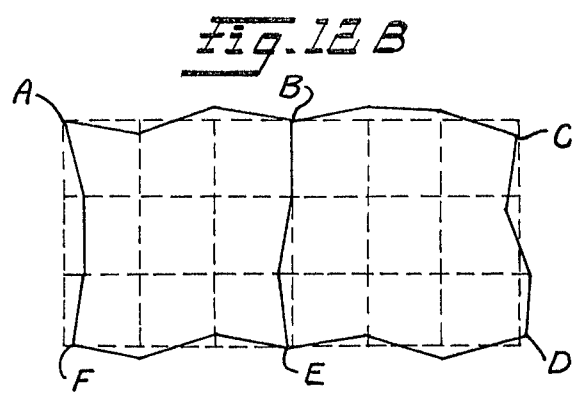
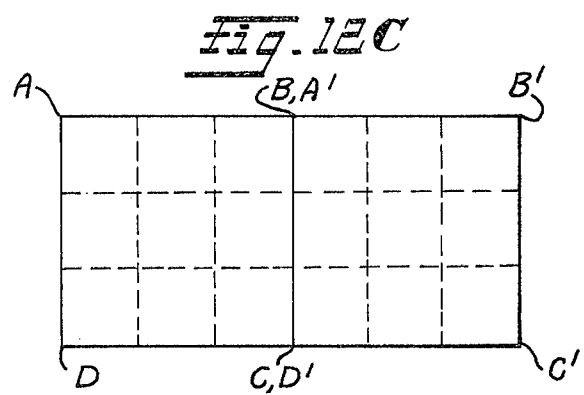

METHOD AND APPARATUS FOR EXPOSING MULTI-LEVEL REGISTERED PATTERNS INTERCHANGEABLY BETWEEN STATIONS OF A MULTI-STATION ELECTRON-BEAM ARRAY LITHOGRAPHY (EBAL) SYSTEM

TECHNICAL FIELD

This invention relates to an electron beam array lithography (EBAL) system particularly designed for use in the fabrication of semiconductor integrated circuits of the LSI (large scale integrated circuits) and VLSI (very large scale integrated circuits) type.

More particularly, the invention relates to a new and improved EBAL system employing electron beam optics of the array optics type wherein a lenslet array assembly is employed in conjunction with an associated fine deflector array assembly to provide precise and extremely fine detailed control over the positioning of an electron beam at any point on the surface of a target workpiece, which might for example be a semiconductor wafer, while tracing out a predetermined pattern over the surface of the individual circuit chip on the workpiece. The system includes means by which any workpiece can be inserted into any EBAL station for registration and exposure of any pattern level of a multi-level set of patterns. Furthermore, a means is provided wherein the effect of flawed lenslets in the lenslet array on the yields of good patterns or circuit chips obtained by the EBAL system can be reduced to a minimum.

BACKGROUND ART

An EBAL system employing an array of fly's eye type electron beam optical column for use in fabricating semiconductor integrated circuits was first described in an article entitled "Integrated Circuit Mask Making by Electron Optical Means" by S. P. Newberry, et al reported in the NEREM Record-1960 on pages 172 and 173. A more complete report of an EBAL system employing a fly's eye electron beam tube was set forth in the IEEE Transactions on Electron Devices, Volume ED-21, No. 9, September, 1974, in an article entitled "Electron Fly's Eye Lens Artwork Camera" by C. Q. Lemmond, et al, on pages 598 through 603. The IEEE article appearing in the September 1974 electron devices issue describes a system wherein lenslet stitching is accomplished by writing test patterns in electron resist on a calibration target, measuring these patterns visually to determine the absolute scale of the patterns and applying corrections to the fine deflection voltages necessary to obtain stitching of the patterns between lenslets. The system was used to write 1×1 inch patterns on 2×2 inch glass plates which were to be used as masks for subsequent exposure of semiconductor wafers by light. The absolute accuracy which was achieved resulted in ±1.25 micro meters ($\mu$m) registration accuracy between patterns written on different plates. A number of problems are associated with this method of achieving stitching and registration: (1) the accuracy is limited by the resolution of the patterns written in the resist and by the light optical instruments used to measure the patterns, (2) no means is provided to correct for inaccuracy which occurs because of the nonorthogonal angle which the electron beam makes at the workpiece when exposure is made on workpieces which are not inserted in exactly the same plane as the original calibration workpiece, and (3) the procedure is tedious and time consuming, a factor which further limits accuracy in actual practice. One of the general purposes of the present invention is to provide a means of lenslet stitching which is capable of accuracy to ±50 nanometers (nm) or better, which is rapid, which utilizes electronic signals to obtain the necessary information from which to derive the correction voltages and which is entirely under computer control. It is also a feature of the system that it can be extended to provide multi-level pattern registration in those cases in which subsequent exposures of different patterns are to be made on the same workpiece after processing between exposures. Also the system can make corrections for workpieces which are inserted such that the surface which is to be exposed does not lie exactly in the same plane as the plane in which the lenslet stitching grid was measured. Furthermore, the system allows a workpiece to be inserted and exposed in any station of a multi-station EBAL system.

In the above referenced IEEE article of September 1974, a multiplicity of workpieces could be mounted in a rotatable turntable which then could be employed to rotate one of the target workpieces into operating position relative to the electron beam optical column. Thus, after a particular target workpiece has been exposed to electron beam treatment, it could be rotated out of operating position and a new target workpiece rotated into position under the electron beam optical column. The entire turntable mechanism was evacuated so that withdrawal of a previously exposed target workpiece and insertion of a new target workpiece did not require releasing and re-establishing the vacuum between the target surface and the electron beam optical column while changing target workpieces. However, once a workpiece was in position for electron beam exposure it was not moved to a different position relative to the electron beam optical column for additional exposure. Thus, with this EBAL system there was no means provided for overcoming the effect of a flawed lenslet in the lenslet array. This in turn placed extremely stringent requirements on the fabrication of the lenslet array and its associated array deflector assembly, making the use of such a system commercially impractical, since the existence of even one flawed lenslet in an array of say 18×18 lenslets could so substantially effect the yield of integrated circuits produced by the EBAL system as to make the manufacture of integrated circuits with such an EBAL system economically impractical. A second objective of the present invention is to overcome this deficiency in the prior art EBAL systems.

SUMMARY OF INVENTION

It is therefore a primary object of the invention to provide a method and system for operating an EBAL system of the type employing fly's eye or array electron beam optics with each electron optical system having an array of lenslets and its associated fine deflector, one or more of which may be flawed, for performing electron beam lithography on the surface of a selected workpiece, e.g., a glass plate or semiconductor wafer. The method and system comprises means for deriving fiducial marking signals from a lenslet stitching grid formed on a standard stitching target for calibrating the boundaries of the fields of view of the surface of the stitching target of the respective elements of the array of lenslets. The fiducial marking signals are used to stitch together the individual fields of view of the elements in the array of lenslets sufficient to cover a desired area of the target workpiece to be exposed to the electron beam and thereafter exposing the desired surface of the target workpiece to the electron beam. The same stitching calibration target, or a precise copy, is used to calibrate all of the exposure stations of a multi-station EBAL system with the result that any level of multilevel registered patterns can be exposed in any of the so calibrated EBAL exposure stations. In the simplest EBAL system, the size of the electron optics array would be equal to or larger than the integrated circuit chip size so that an entire chip could be exposed without moving the workpiece. In order to register the levels of multi-level patterns written on the same chip, each chip is provided with a registration fiducial grid comprised of fiducial marks at the corners and only at the corners of the chips. Preferably, the dimensions of a chip are integral multiples of the dimension of the individual lenslet fields so that the four chip fiducial marks are nominally in the same relative positions as some particular four lenslet stitching fiducial marks.

The desired area of the surface of the workpiece is then exposed by computer control of the blanking, spot selection, and deflection of the electron beam. Means are also provided for mapping in a computer memory the location of any flawed lenslet in the lens array and this information is used to blank the electron beam during any period that the coarse deflector might be directing the beam to a flawed lenslets. Means are then provided for permuting the physical position of the exposed target area to a new physical position subject to the field of view of a different set of array lenslets whose combined field of view again covers the desired area of the target surface to be exposed. Control signals are then derived from the mapping computer memory for controlling operation of at least the coarse deflector, the fine deflector, the spot selection, and the blanker assemblies of the electron beam optics for redirecting the electron beam back to the previously unexposed area, which has been under a flawed lenslet. Thereafter, the electron beam is caused to be retraced over such an area in accordance with the master pattern specifications for that area location on the target workpiece surface whereby increased yield from the EBAL system is obtained.

Another feature of the invention is a simple mechanical means for exposing a workpiece area which is greater than the area of the array optics. This is accomplished by four 90° rotation steps of the wafer around a rotation center which is not coincident with the center of the array optics. Subsequent permutation to expose areas previously under flawed lenslets is achieved in the same EBAL vacuum station in which it was first exposed, by translation of the center of rotation to a new physical location followed by a second set of four 90° rotation steps.

A further feature of the invention is the provision of a plurality of parallel operated EBAL stations with each EBAL station comprising a separate electron beam optical column of the fly's eye type and wherein the high voltage and electron gun power supplies, the pattern position dependent fine deflection, electron beam spot size selection control, coarse deflection, and rotation and translation control for permutation of exposure for all of the electron beam optical columns are controlled in common by an overall system computer, and the blanking control, stigmation control, dynamic focus, lenslet stitching, workpiece registration, flawed lenslet mapping and control, fine deflection correction, and flawed lenslet pattern memory and control, are individually controlled for the respective stations by an individual station computer for that station.

BRIEF DESCRIPTIONS OF DRAWINGS

These and other objects, features and many of the attendant advantages of this invention will become better understood upon a reading of the following detailed description when considered in connection with the accompanying drawings, wherein like parts in each of the several figures are identified by the same reference character, and wherein:

FIGS. 1A, 1B, 1C and 1D illustrate the nature of one possible type of fiducial mark formed on or adjacent to the semiconductor wafer target surface, the manner in which a fiducial marking signal is obtained by means of the fiducial mark, and the nature of the signal.

FIG. 2 is a sketch illustrating the manner in which the fiducial marks are placed on or near the lenslet stitching target surface on the boundary corresponding to two adjacent lenslets so as to obtain fiducial mark signals which define the location of the fiducial marks and will subsequently enable stitching together of the boundaries of the fields of view of adjacent lenslets on the final workpiece surface.

FIG. 3 is a sketch illustrating the manner in which fiducial marks might be placed on a lenslet stitching grid which extends over an exemplary 3×3 lens array and shows how the placement of these fiducial marks can be expected in actual practice to deviate from the ideal positions of a perfect mathematical grid.

FIGS. 4A, 4B and 4C illustrate the steps by which the mathematical grid is transformed or mapped into the lenslet stitching grid on the stitching calibration wafer and how in turn a chip registration grid, formed on or adjacent to the surface of a target semiconductor wafer at the chip corners for use in registering and reregistering the chips on a wafer target surface relative to the electron beam tube electron optical column, is also mapped into the lenslet stitching grid.

FIGS. 5A and 5B illustrate the basic principle which is used in solving the problem of stitching errors caused by nonorthogonal landing of the electron beam at the workpiece surface.

FIG. 6 is a diagrammatic sketch illustrating the supposed field of view of two EBAL stations A and B used to solve the flawed lenslet problem for stations with four chips per station using sixteen lenslets per chip with non-overlapping flawed lenslets X.

FIG. 9A is a functional block diagram of an overall EBAL station employing a single fly's eye electron beam optical column together with its associated control circuits including both a system computer and an individual station computer for controlling the various control circuits and elements to achieve the effect shown in FIGS. 8A, 8B and 8C.

FIGS. 9B and 9C show details of construction of the target wafer support whereby both translation of the center of rotation and rotation of the target surface can be achieved.

Figure 7A:
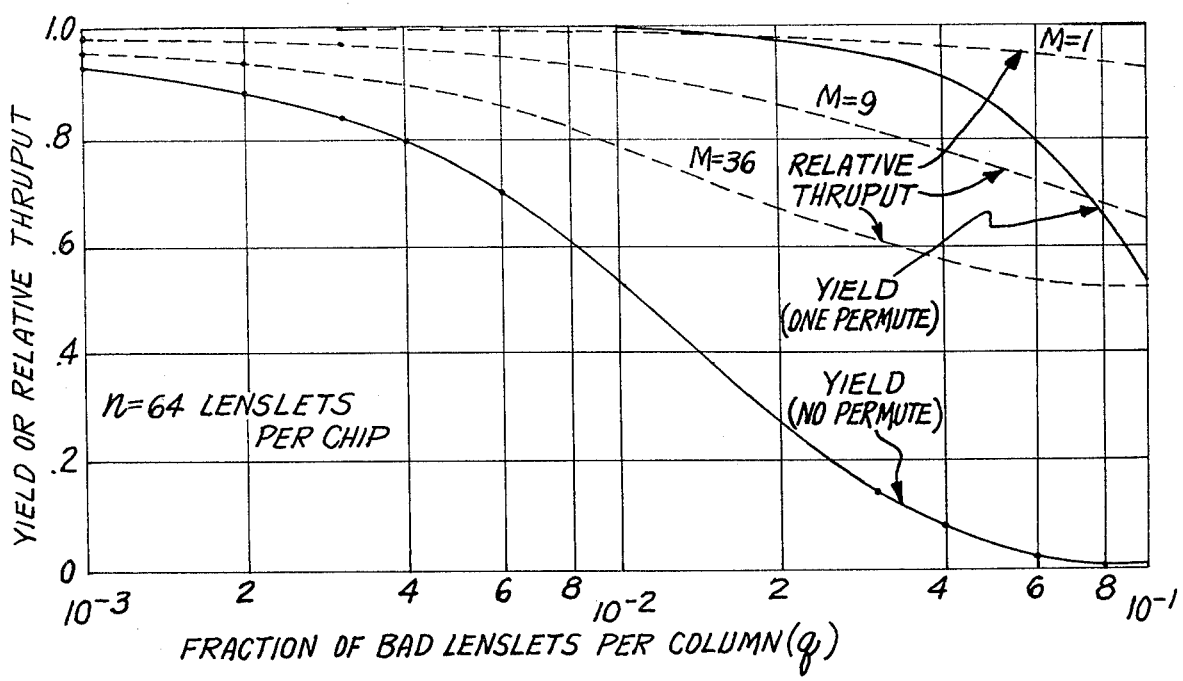
FIGS. 7A and 7B show the effect of bad lenslets on the yield of good IC chips for the case of a single exposure (no permute) and double exposure (one permute) with sixty-four lenslets per chip and also shows the relative thruput of workpieces for the case of double exposure and 9 or 36 electron optical columns which share the same coarse deflection.

FIGS. 11A and 11B form a functional block diagram of an EBAL system comprising a plurality of parallel-operated EBAL stations which share a common system computer and common control circuits such as the high voltage and electron gun power supplies, rotation and translation control for permutation of exposure, and pattern memory, which partially share spot selection control, coarse deflection, pattern dependent fine deflection, and flawed lenslet pattern memory and control, and further including individual station computers for further controlling operation of the individual electron beam optical columns with regard to the blanker, beam steering, stigmation, array lens dynamic focus, lenslet stitching operation, workpiece registration control, and the flawed lenslet mapping memory and control.

FIGS. 12A, 12B and 12C are diagrammatic sketches which illustrate in greater detail the problem of mechanically stitching together the fields of view of the electron optical column.

BEST MODE OF PRACTICING INVENTION

In order to employ an electron beam optical column having array optics in an electron beam array lithography system, three substantial problems must be solved. The first problem encountered arises from the fact that the field of view of each individual lenslet is not large enough to cover an entire integrated circuit pattern thus requiring the use of multiple lenslets per pattern. Hence, beam stitching must be achieved on the boundaries between the fields of view of adjacent lenslets. A second problem is that reregistration of the fields of view of the lenslets relative to previously exposed patterns on the workpiece, which may correspond for example to integrated circuit chips on a silicon wafer, must be achievable in order to allow the workpiece or wafer to be removed for processing in a special atmosphere or solution for layer deposition or formation purposes, etching and similar process steps that must be conducted sequentially by layers on the surface of the workpiece or semiconductor target wafer. Finally, because it is difficult and costly, if not economically infeasible, to produce perfect lenslet arrays for use in fly's eye electron beam optical columns, the problem of the existence of one or more flawed lenslets in the array must be overcome in order not to seriously impair production yields of the patterns or integrated circuit chips by the EBAL system.

In any given fly's eye electron beam optical column, the size of the field of view of an individual lenslet in the lenslet array is determined by the desired electron beam current and electron beam spot size. Lenslets in known fly's eye electron beam optical columns are on the order of 50 mils (1.3 mm) center-to-center spacing which therefore defines a 50×50 mil field of view. It does not appear feasible to increase this field of view substantially and still maintain adequate current density, small spot size, and precise spot position control at the target surface. Consequently, since semiconductor integrated circuit chip sizes in the range of 100 to 400 mils are required by the integrated circuit industry, an EBAL station according to the invention must use the fields of view of multiple lenslets in order to expose any given IC chip. For example, electron beam optical columns having lenslets in the lenslet array of the above-stated size and center-to-center spacing, would require lenslet subarrays of 2×2 or 8×8 in order to expose 100 or 400 mil IC chips, respectively.

In order to use arrays of multiple lenslets per IC chip, it is necessary to "stitch" the fields of view of two adjacent lenslets along the lenslet boundaries. Furthermore, as noted previously, successive levels of materials deposited or otherwise formed on the surface of the workpiece or semiconductor target wafer must be reregistered over the entire area of the integrated pattern or IC chip following each removal of the workpiece or wafer for a processing step and reinsertion back into the fly's eye electron beam optical column for further exposure to the electron beam. The first step in meeting this requirement is to provide highly accurate lenslet stitching and chip registration grids of fiducial elements which are compatible with the short working distances of the array optics system. For example, it is only 250 mils (6.3 mm) between the outlet of the fine microdeflector assembly and the target surface in conventional fly's eye electron beam tubes.

One possible fiducial element used in forming the stitching and registration grids is shown in FIGS. 1A, 1B, and 1C and a fiducial output marking signal pulse produced by such element is illustrated in FIG. 1D. A fiducial element of this form has previously been described by Y. Iida and T. E. Everhart in an article entitled "High-contrast registration marks for electron-beam pattern exposure on (100) silicon" which appeared in the Journal of Vacuum Science and Technology for May/June 1978, page 917. Referring to FIGS. 1A through 1C, it will be seen that square tapered holes are etched in (100) Si. These holes are formed by anisotropic etching and should in principle have definition to within one atomic plane, i.e., to less than 9 nanometers (nm). The angle of 54.7 degrees shown in FIG. 1C, which together with the thickness of the silicon wafer defines the relative sizes of the top and bottom square holes, is determined by the orientation of (111) crystal faces. The sharpness of the intersection of the hole with the wafer surface is determined in principle by the spacing between (111) planes which is approximately 3 Å units (0.3 nm). The production square holes having edges thus formed are believed to provide sufficient resolution for all presently known and future anticipated registration and reregistration needs for the EBAL system. The fiducial element is completed as shown in FIG. 1C by positioning of a suitable semiconductor silicon detector below the fiducial hole which produces an output electric signal upon impingement of the electron beam thereon. This output signal is then amplified in an amplifier to produce an output signal pulse as shown in FIG. 1D. The position of the electron beam is determined by sweeping across the hole and generating a signal as shown in FIG. 1D. Given a smooth and sharp edge for each fiducial hole, electronic processing of this signal can easily yield a determination of the spot center of the electron beam to less than 1/10 of the electron beam spot diameter. By further processing of the resulting signals, the center of the fiducial squares can be located to within ±50 nm or better.

As best seen in FIG. 2 of the drawings, a set of fundamental fiducial elements (labeled "I") placed along the boundary between the fields of view of two adjacent microlenslets at their corners can be used to "stitch" together the boundaries of the fields of view of the two lenslets since the electron beam from either lenslet can be positioned to within less than 50 nm at the fiducial hole centers. By this means, correction can be made for off-set, rotation, quadrilateral distortion, and sensitivity variations. The rest of the boundary can be stitched together by theoretical extrapolation which takes into account any nonlinear deflector distortion (barrel or pin cushion) which is best determined by computer simulation of the deflector. Adding a fiducial element to the lenslet boundary, for example at "II" in FIG. 2, enables the theoretical distortion parameters to be either verified or determined empirically. A more general theory of stitching and registration by this means will be discussed hereinafter with relation to FIGS. 3 and 4 of the drawings.

In the simplest embodiment, a lenslet stitching calibration grid is made by placing fiducial holes at the corners of the fields of view of each lenslet as shown in FIG. 3 of the drawings. In principle, variations in size, shape and placement of these fiducial holes can exceed the design requirements for registration of multi-level circuits, which might be as small as 50 nm, for circuits having smallest features of 0.5 μm. In practice, hole size variations will occur due to variations in semiconductor chip wafer thickness, hole shape will vary due to impurities or strain in the wafer, and the placement of holes will vary due to limitations of the lithography equipment used to make the stitching or registration fiducial masks. Typical specifications of $1 \pm 0.4$ mils (i.e., $25 \pm 10$ μm) for hole size and $\pm 1$ μm for hole placement are indicated in FIG. 3. These deviations from a perfect mathematical grid are shown in FIG. 3 on an exaggerated scale in order to be visible to a viewer of the drawing.

The method of achieving multi-level pattern registration by mapping the stitching calibration grid onto a workpiece or semiconductor wafer or chip to be processed in the EBAL system is described hereinafter in the following paragraphs. Briefly, however, a chip registration grid is defined by first producing fiducial marking holes at the corners of each chip. Then, by measurement of the position of these holes, a transformation can be computed into a computer which will in turn map the chip registration grid into the lenslet stitching grid by means of which patterns are actually written on the wafer. With this method, chip by chip corrections can be made for semiconductor wafer insertion errors (translation or rotation) and wafer dimensional changes due to expansion or quadrilateral distortion.

The general problem of stitching and registration is to transform between three grids as shown in FIGS. 4A, 4B, and 4C. The first grid shown in FIG. 4A is a mathematical grid defined by the coordinates $x_0$, $y_0$ such that the corners are at $x_0 = \pm 1$, $y_0 = \pm 1$. This grid could be accessed by applying voltages $\bar{V}_x x_0$, $\bar{V}_y y_0$ to an ideal hypothetical array optical system which is both perfect in construction and linear in deflection as observed in the target plane. This grid is congruent to all lenslets. The second grid is the lenslet stitching calibration grid which is accessed by real voltages $V_x(x_0, y_0)$ and $V_y(x_0, y_0)$. The corners of this grid are determined by the actual physical locations of fiducial marks. The positions of interior points within this grid relative to the corners are determined by three main factors which are: firstly, the nonlinear relation between deflection voltage and spot position at a target associated with all electron optical systems; secondly, the deviations from perfection in the construction of the array optical system such as variations from lenslet to lenslet in dimensions and placement of the various elements such as array deflector bars and the lenslets in the lens array; and thirdly, the form of the equations used to map ideal voltages from the ideal mathematical grid into real voltages associated with the lenslet stitching grid. The third grid is the chip registration grid formed on the surface of the semiconductor wafer by placing fiducial marks at the corners of each chip and is defined by the chip-centered coordinates X, Y, such that the corners are at $X = \pm(1 + I_{max})$ and $Y = \pm(1 + J_{max})$ where I and J are indices that locate a lenslet within a chip. From one lenslet to the next these indices increment by 2 units, reaching values of $\pm I_{max}$ and $\pm J_{max}$ at the edges of the chip. Lenslet stitching requires mapping of the mathematical grid a b c d into the lenslet stitching grid a′ b′ c′ d′ with a sufficient number of nonlinear voltage terms such that the lines connecting the corners of the mathematical grid and which define the boundaries between lenslets in mathematical space are mapped into two such boundary lines on the lenslet stitching grid (one for each lenslet), which are sufficiently close together such as to be within the acceptable range of stitching error. Hence, it follows that the required mapping equation between the mathematical grid and the lenslet stitching grid depends on the specifications for stitching accuracy.

One possible set of mapping equations is given by:

$$V_x = \bar{V}_x[C_{00} + (1 + C_{10})x_0 + C_{01}y_0 + C_{11}x_0y_0 + (g_{10}x_0^2 + g_{01}y_0^2)x_0] \quad (1)$$

$$V_y = \bar{V}_y[D_{00} + (1 + D_{01})y_0 + D_{10}x_0 + D_{11}x_0y_0 + (h_{10}x_0^2 + h_{01}y_0^2)y_0]. \quad (2)$$

In these equations the C and D coefficients are determined for each lenslet by measuring the voltages $V_x$ and $V_y$ which place the beam at the positions of the lenslet stitching grid fiducial marks, and the values of $x_0$ and $y_0$ are taken as $(1,1)$, $(1,-1)$, $(-1,-1)$ and $(-1,1)$ at the fiducial marks corresponding to the appropriate mathematical grid corners. The g and h coefficients for nonlinear pincushion distortion ($g_{01}$ and $h_{10}$) and nonlinear gain ($g_{10}$ and $h_{01}$) can be quite accurately determined by computer simulation of the properties of the array optical fine deflector. The constants $\bar{V}_x$ and $\bar{V}_y$ are the nominal full-field deflection voltages, which may be found experimentally or by computer simulation. Finally, with measured values of $V_x$ and $V_y$ at the four corners of the stitching grid, the assumed values of $x_0$ and $y_0$, and the calculated values of g and h it is possible by standard methods to solve Equations (1) and (2) for the eight C and D constants. From the form of Equations (1) and (2) it will be recognized that the constants represent the following topological effects:

| | |
|---|---|
| Displacement | $C_{00}$, $D_{00}$ |
| Rotation | $C_{01}$, $D_{10}$ |
| Expansion | $C_{10}$, $D_{01}$ |
| Quadrilateral Distortion | $C_{11}$, $D_{11}$ |

The accuracy of the determination of the g's and h's can be checked subsequently by measurements at additional stitching grid points as suggested with relation to FIG. 2.

Should stitching using the Equations (1) and (2) be found insufficiently accurate, additional second, third and even higher order terms in $x_0$ and $y_0$ can be added to these equations, with the corresponding addition of additional fiducial marks along the boundaries of the lenslet fields in order to provide more measurements with which to determine the values of the additional constants, as well as values of the nonlinear distortion constants $g_{01}$ and $h_{10}$. To those skilled in the required art this process can be extended as far as is necessary to obtain the requisite accuracy for any particular application.

If calibration to an absolute standard is desired, for example to achieve close compatibility with wafer exposure masks made by other methods, the positions of the fiducials marks on each lenslet stitching calibration grid may be measured using firstly a laser interferometer calibrated stage for coarse positioning over each fiducial mark and secondly an electron beam column to locate fiducial mark centers precisely. From these measurements the deviations between the position of each lenslet stitching grid fiducial mark and its location on an ideal, mathematical grid, are obtained. These deviations would then be used to modify Equations (1) and (2), to provide a precisely mapped lenslet stitching calibration grid.

It may be desired to write patterns which are larger than the field of view of the array of lenslets. In such a case it is necessary to move the workpiece and subsequently stitch the pattern along the boundary between the regions of the chip written at different stage positions. Stitching of this type will be called "mechanical stitching". If there are fiducial marks on the workpiece, then by placing fiducials at the ends of the two boundaries which are to be stitched, mechanical stitching can be accomplished by the methods described in connection with the chip registration grid. However, if there are no fiducials on the workpiece, as for example would be the case in writing a pattern on a reticle or mask for subsequent use in a light optical or x-ray exposure station, then additional techniques must be introduced to accomplish mechanical stitching.

The problem of mechanical stitching is explained in more detail by reference to FIG. 12A. This figure depicts a 3×3 lenslet array and corresponding lenslet stitching calibration grid 70 with corners A, B, C, D. For clarity only the outer boundary of this grid is shown, along with the underlying mathematical grid 73. Now in order to write a larger area, say for example an area requiring 3×6 lenslets, it is necessary to translate the workpiece by a distance corresponding to 3 lenslets. The mapping of the lenslet stitching calibration grid into the workpiece in this new position is designated as A'B'C'D'. The problem of mechanical stitching is now seen to be the problem of making the boundary A'D' match the boundary BC, which due to the random deviations from perfect placement of the fiducial marks is seen from FIG. 12A to be impossible. In the example of FIG. 12A, stitching is attempted by matching the points B and A' with the result that no pattern is written in the area 72 and mechanical stitching is not achieved.

Two methods of achieving mechanical stitching are shown in FIGS. 12B and 12C. In FIG. 12B the lenslet stitching calibration grid ABCDEF is made large enough to cover the entire area of the pattern which is to be written (3×6 lenslets). Hence after motion of the workpiece the boundary BE is stitched by using the methods described in connection with the chip registration grid.

A second method of achieving mechanical registration is shown in FIG. 12C. In this case the lenslet stitching calibration grid is only as large as the lenslet array but now the deviations from a perfect orthogonal mathematical grid are measured by some independent means, such as by using a laser controlled stage in combination with an electron beam, and the measured position of the fiducial marks used as data to insert corrections such as to make the lenslet stitching calibration grid appear to be a perfect orthogonal grid. Hence after movement of the workpiece the boundaries BC and A'D' can be made to match and hence mechanical stitching can be accomplished.

Chip mapping requires that the grid ABCD shown in FIG. 4C be mapped into A'B'C'D shown in FIG. 4B. A particularly convenient way to achieve this is to first transform the chip grid described by X and Y into the mathematical grid described by $x_0$ and $y_0$, where the variables X and Y describing the chip registration grid are of the same ideal hypothetical form as described previously for the mathematical grid variables $x_0$ and $y_0$, but defined over a chip covered by the field of view of a multiplicity of lenslets. The appropriate equations are $$x_0 = E_{00} - I + (1+E_{10})X + E_{01}Y + E_{11}XY \quad (3)$$

$$Y_0 = F_{00} - J + (1+F_{01})Y + F_{10}X + F_{11}XY \quad (4)$$

which contain only linear terms in X and Y, based upon the assumption that all wafer insertion and processing distortions can be assumed to be linear over a chip. Thus, the E and F constants again describe the same topological effects as the corresponding C's and D's described above, but on a chip rather than a lenslet level. In order to determine the E's and F's, the values of $x_0$ and $y_0$ associated with the voltages $V_x$ and $V_y$ which are required to reach the corresponding chip registration fiducial marks from each corner lenslet are determined by use of the mapping Equations (1) and (2). The procedure is to measure $V_x$ and $V_y$ required to deflect the beam to the chip registration fiducial marks and then use equation (1) and (2) with the values of the C's and D's previously determined for each lenslet as described above to solve these equations for the four pairs of values for $x_0$ and $y_0$. Inserting these values $x_0$ and $y_0$ and the appropriate values of X, Y, I, and J into equations (3) and (4) then allow the determination of the E's and F's. For the examples in FIG. 4C, the values of X, Y, I and J at the four points ABCD are

| POINT | X  | Y  | I  | J  |
|-------|----|----|----|----|
| D     | −2 | −2 | −1 | −1 |
| C     | 2  | −2 | 1  | −1 |
| B     | 2  | 2  | 1  | 1  |
| A     | −2 | 2  | −1 | 1  |

Should chip registration using the Equations (3) and (4) be found insufficiently accurate, additional terms which are higher order in X and Y can be added to these equations, with the corresponding addition of fiducial marks along the boundaries of the chips in order to provide more measurements with which to determine the values of the additional constants. To those skilled in the required art this process can be extended as far as is necessary to obtain the requisite accuracy for any particular application. Fiducial marks may also be supplied at a plurality of positions along chip boundaries to provide redundancy for determining with higher reliability the constants in Equations (3) and (4), or their augmented versions. Finally, fiducial marks may be supplied within the interiors of the chips in order to be able to write continuous patterns on the same chip using two or more adjacent stage positions, for example because the chip size is larger than the array size. In this case, preferably the additional fiducial marks are located at points along the boundaries between regions of the chip written at different stage positions.

In principle the calibrations required to achieve stitching and registration are now complete. A user of the system will specify the values of X and Y considered as linear orthogonal coordinates which describe the pattern to be created by the EBAL system. The required deflection voltages which must be applied to the fine deflection system are determined by first finding the values of I and J where $$X = x + I \quad (5)$$

and $$Y = y + J \quad (6)$$

such that
$$-1 < x \leq 1$$
and
$$-1 < y \leq 1$$

Then the values of X, Y, I, and J are inserted into equations (3) and (4) to determine the corresponding values of $x_0$ and $y_0$. These values of $x_0$ and $y_0$ are now inserted into equations (1) and (2) to determine the actual deflection voltages $V_X$ and $V_Y$. Of course it is possible to perform these two operations in general by algebraic manipulation of the above equations, i.e., by inserting equations (3), (4), (5), and (6) into (1) and (2) and expanding and grouping terms to finally obtain equations of the form $$V_x = \overline{V}_x[G_{00} + (1 + G_{10})x + G_{01}y + G_{11}xy + (g_{10}'x^2 + g_{01}'y^2)x] \quad (7)$$

$$V_y = \overline{V}_y[H_{00} + (1 + H_{01})y + H_{10}x + H_{11}xy + (h_{10}'x^2 + h_{01}'y^2)y] \quad (8)$$

where the new constants G, H, g', and h' are algebraic combinations of the C, D, E, F, g, h, I, and J constants.

The next problem which must be considered is the inaccuracy in stitching and registration which can occur due to the nonorthogonal angle which the electron beam makes at the workpiece when exposure is made on workpieces which are not inserted at exactly the same height as the original lenslet stitching calibration grid. The problem is best explained by reference to FIG. 5A and FIG. 5B. FIG. 5A depicts a two-lenslet chip having chip registration marks at the corners of the chip, while FIG. 5B shows the position in which the lenslet stitching grid was initially inserted when determining the stitching coefficients (C's and D's of Equations (1) and (2)) and also shows the position of a wafer which has subsequently been inserted for exposure in the EBAL system and on which a chip registration grid has been incorporated. For simplicity in illustrating the height problem it is assumed in the FIGS. 5A and 5B drawings that the chip registration grid is exactly congruent with the outside corners of the lenslet stitching grid and that the wafer has been inserted such that these grid markers are exactly registered with the original position of the lenslet stitching grid markers but are displaced in height by a distance $\delta h$. The stitching error which is shown in FIG. 5B occurs for the following reason: when the chip registration marker at point A' is measured from lenslet 1, the angle through which the beam has been deflected is such as to cause intersection with the original plane in which the lenslet stitching grid was measured at point $A_1$. Hence, the stitching algorithm will interpret the deflection voltage as indicating that the target has been locally shifted to the right by the horizontal distance between $A_1$ and A' or the amount $\Delta_1$, as shown in FIG. 5B. Similarly, when the chip registration marker at C is measured from lenslet 2, the stitching algorithm will indicate that the target has been locally shifted to the left by the distance $\Delta_2$, which for this example is equal to $\Delta_1$. The chip to lenslet mapping, Equations (3) and (4), will interpret these shifts as a contraction, which it will attempt to correct via the constants $E_{10}$ (and $F_{01}$). Then during exposure when the beam is deflected to B from lenslet 1, the registration algorithm, Equations (7) and (8), will cause the beam to intersect point B in the lenslet stitching grid plane but reach point $B_1'$ in the target (chip registration) plane. When the same point is accessed from lenslet 2, the beam will again intersect B in the lenslet stitching grid plane, but reach point $B_2'$ in the target plane. Thus, there will be a stitching error between lenslet 1 and lenslet 2 as indicated.

The stitching error due to incorrect height placement can be corrected by utilizing the well known properties of stereoscopic vision, which can be applied to the present problem by viewing the chip fiducial marks from two adjacent lenslets. Consider viewing the chip fiducial mark at A from lenslet 1 and from an additional adjoining lenslet 0 immediately to the left of lenslet 1 as shown in FIG. 5B. From lenslet 1, a displacement $\Delta_1$ is measured between the apparent position of the chip fiducial mark at A in the -plane (lenslet stitching grid) and its original position (during lenslet calibration). Similarly, from lenslet 0 a displacement $\Delta_G$ is measured. Then defining h as the distance from the X-plane to the center of deflection and remembering that the lenslet fiducial marks are defined as being at coordinates $x = \pm 1$ when measured from lenslets 0 and 1 respectively, it follows from simple geometry that $$\frac{\delta h}{h} = \frac{\Delta_0 + \Delta_1}{2 - (\Delta_0 + \Delta_1)} \quad (9)$$

Furthermore from FIG. 5B it also follows that distances in the x'-plane are related to distances in the x-plane by $$x' = x(1 + \delta h/h) \quad (10)$$

so that once $\delta h/h$ has been determined by Equation (9), (or by direct measurement) Equation (10) can be used to correct stitching errors in the x'-plane. The above example of height correction has been a simplified example chosen to illustrate the general principle of stereoscopic vision. A more complete theory must take account of displacement and rotation effects of the chip registration grid in the x'-plane as well as tilt of the x'-plane. When taking account these more general effects, the preferred method of applying the necessary corrections to obtain stitching is to modify the G and H constants of Equations (5) and (6) in an appropriate way which can be readily derived by those skilled in the art. By these means stitching can be achieved even though the workpiece (containing the chip registration grid) and the lenslet stitching grid are not inserted in the same position in the electron optical column.

In order to better appreciate the flawed lenslet problem, consider the following example where it is assumed that a semiconductor chip is covered by a 4×4=16 micro-lenslet array. Since the failure of any lenslet in the array would result in a bad chip, if the average fraction of flawed lenslets is equal to 0.05 (lenslet yield=95 percent), the chip yield would be reduced to $(0.95)^{16}$ equals 44 percent. Similarly, an 80 percent chip yield corresponds to a 0.014 fraction of flawed lenslets (lenslet yield=98.6 percent). At the present stage of micro-lenslet array development, the lenslet yield can be expected to be 90 to 95 percent. For the above example, 90% lenslet yield would result in a chip yield of only 19 percent. Although improvement can be expected, it is not known if a lenslet yield of 98.6 percent or more can be achieved. Consequently, it is important to consider means for reducing the requirement on the lenslet yield. This can be done by permuting a wafer between electron beam stations as discussed below.

The flawed lenslet problem can be solved by permuting a wafer between two stations as illustrated in FIG. 6 of the drawings. FIG. 6 illustrates two exposure stations A and B each having a fly's eye electron beam optical column wherein four chips are exposed with sixteen lenslets required to cover each chip and with flawed lenslets X which are different in stations A and B. The total system consists of N pairs of A and B stations for a total of 2N stations all operating in parallel. The first step in processing a wafer is to simultaneously expose a wafer in each station pair such as A-1 and B-1. Common coarse deflection lenslet selection is used for both stations A-1 and B-1 but the electron beams are selectively blanked when accessing a flawed lenslet. The wafers then are subsequently permuted between A-1 and B-1 and the flawed lenslet subjected areas of the wafers then are exposed in the permuted stations. If there is no overlap of flawed lenslets, as is the case in FIG. 6, then both wafers will have been fully exposed. For 90 percent lenslet yield in a system such as shown in FIG. 6, there will be on the average 1 percent overlap of flaws between stations A and B. Hence, out of the 16 lenslets of a given chip, 0.16 will be flawed in both station A and B and the chip yield is approximately $(0.99)^{16}$=85 percent. Introduction of a third station C (not shown in FIG. 6) and a second wafer permute would then reduce the flaw overlap to 0.1 percent and increases the chip yield to about 98 percent. These examples suggest a minimum goal for lenslet yield of about 95 percent, which with one permute between two stations would then result in 96 percent chip yield for 4×4=16 lenslet chips, dropping to 85 percent for 8×8=64 lenslet chips. The basic pair of A and B stations could then be duplicated N times to provide a total parallel system of 2N stations having 94 percent chip yield. Consideration of the effect of the time for the permuted exposure on thruput which is discussed below further suggests that a better goal for lenslet yield might be about 99 percent.

In the above discussion, the time required for the second (permuted) exposure was not considered. In order to calculate the time for the second exposure define:

$T_1$ = time for first exposure
$T_2$ = time for second exposure
$T = T_1 + T_2$ = total time for exposure
q = fraction of bad lenslets
M = number of electron optical columns which share common spot selection, coarse deflection, and pattern dependent fine deflection control, and pattern generating software.

Then since the probability of a given exposure field on the workpiece in one column needing and benefiting from a second exposure is q(1−q) where q is the probability of need due to the given exposure field being under a bad lenslet on the first exposure and (1−q) is the probability of benefit due to the given exposure field being under a good lenslet in the second exposure. Then the probability of the same exposure field in any of M electron optical columns needing and benefiting from a second exposure is $1-[1-q(1-q)]^M$. Furthermore, this latter probability is also the fraction of all lenslets in the M columns which are given a second exposure, and hence the ratio $T_1/T_2$ is given by $$T_1/T_2 = 1 - [1 - q(1-q)]^M \quad (11)$$

The thruput is proportional to the inverse of the total time for exposure or $$\text{Thruput} \propto 1/T = 1/T_1(1/1 + T_2/T_1) \quad (12)$$

and the thruput relative to the thruput for one exposure only, or relative thruput, is given by $$\text{Relative thruput} = 1/1 + T_2/T_1 \quad (13)$$

Also, by introducing
n = number of lenslet per chip
the yields for one and two exposures, i.e., for no permute and one permute, can be written as $$\text{Yield (no permute)} = (1-q)^n \quad (14)$$

$$\text{Yield (one permute)} = (1-q^2)^n \quad (15)$$

or more generally for p permutes $$\text{Yield (p permutes)} = (1-q^p)^n \quad (16)$$

The yields of good IC chips from Equations 14 and 15 are plotted in FIG. 7A as a function of the fraction of bad lenslets q for the case of 8×8=64 lenslets per chip, i.e., n=64, and the two case of single exposure (no permute) and double exposure (one permute). From FIG. 7A it is seen that in order to obtain a yield of 90% with no permute, the fraction of bad lenslets must be equal to 0.0016. Such a high degree of perfection may be difficult if not impossible to achieve in practice and for this reason the use of at least one permute may be necessary. From FIG. 7A it is seen that by using one permute a yield of 90% can be achieved with as high as q=0.04 bad lenslet fraction, which is 25 times more than for the case of only one exposure.

Figure 7B:
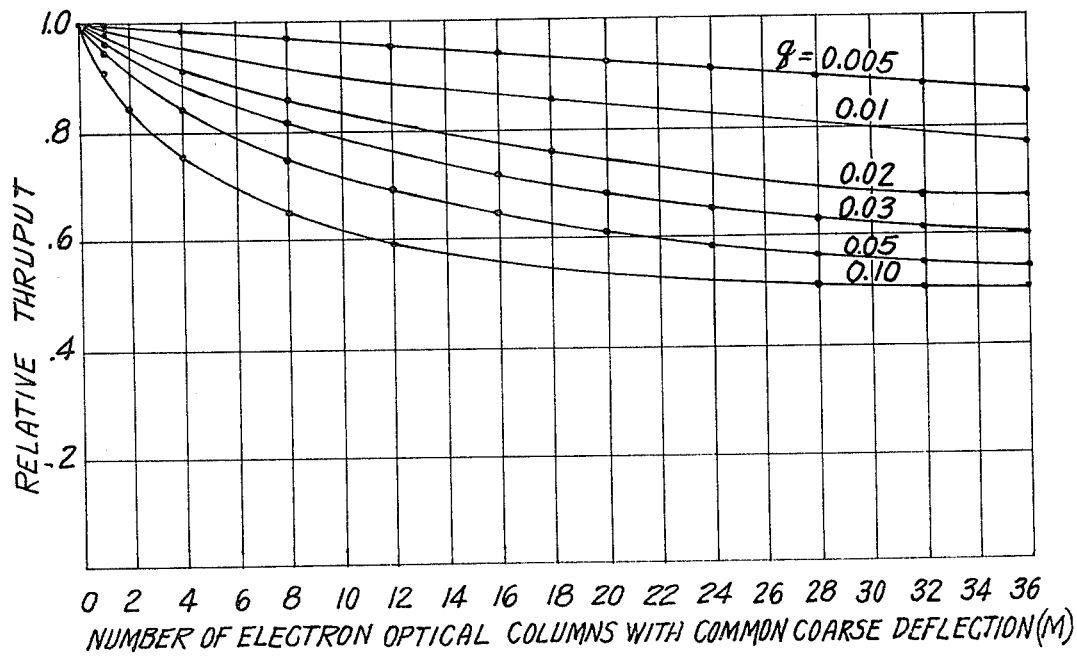

The effect of double exposure on thruput is also given in FIG. 7A which shows the relative thruput (relative to the thruput for single exposure) for three different values of M (the number of electron optical columns in the EBAL system which share common spot selection, coarse deflection, and pattern-dependent fine deflection control plus pattern generating software), namely for M=9 and M=36, as well as M=1 for reference. It is seen that although the yield is still 90% for q=0.04, the relative thruput has fallen to 77% for M=9 and to 57% for M=36. Much better relative thruput values are obtained for q=0.01 for which relative thruputs of 92% and 77% are obtained for M=9 and M=36, respectively, while at this value of Q the chip yield has risen to 99.4%. The relative thruput as a function M is shown in FIG. 7B with the bad lenslet fraction q as a parameter. The choice of where to operate on this curve, i.e., what choice to make for M, is a complicated engineering performance/cost trade-off. Suppose, for example, a total of 36 columns are desired, and q=0.01 (99% lenslet yield). If M is equal to one, the thruput is maximum at 99%, which is desirable; however, for a system containing a total of 36 columns, the cost of 36 independent spot selection controls, coarse deflection controls, and partial fine deflection controls, plus independent pattern generating software, will be considerable. Thus, the preferred configuration, for which a high lenslet yield is required (e.g., 99.5% for 36 columns) is for M to be equal to the total number of electron optical columns, thereby minimizing the cost of complicated and expensive deflection and pattern generating hardware and software. However, all of the cost elements of the system must be known and also the dollar value of thruput must be determined in specific manufacturing environments before a determination of the most cost effective value for M can be made. For lenslet yield of 99%, it seems reasonable to guess that a value of M of 9 might be a good choice since the relative thruput is still 92% and now only 4 independent coarse and fine deflection system and pattern generating systems are required. In any event, given the lenslet yield, typical chip size, and relevant cost parameters of a given application of an EBAL system, it is straightforward to those skilled in the art to determine a favorable choice for M.

As noted above, in order to solve the problem of flawed lenslets as discussed with relation to FIG. 6, it is necessary to expose a semiconductor target chip in two or more different EBAL electron optical columns. This can be done if the same stitching calibration grid discussed with relation to FIG. 3 and FIG. 4B or a precise copy, or a similar precisely mapped grid is used to calibrate the stitching of the optics of all of the different EBAL columns. As a result of this common stitching calibration, the lenslet fields in all of the columns are congruent with each other and then would require only overall rotation and displacement correction to precisely superimpose, and therefore match exactly the different overlying layers of subsequently inserted semiconductor IC chip target wafers in any of the EBAL stations.

Figure 8C:
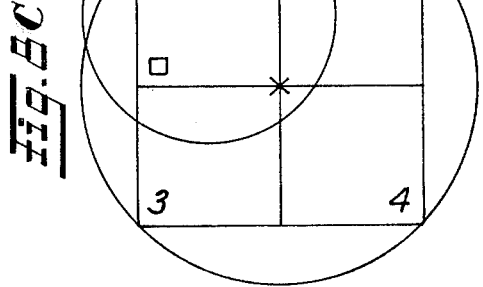
FIGS. 8A, 8B and 8C illustrate a method for permuting a target wafer surface within the same electron beam exposure chamber by exposure of the wafer surface, displacement of the center of rotation of the wafer and subsequent rotation of the wafer about the displaced new center of rotation relative to the electron beam optical column.
Figure 8B:
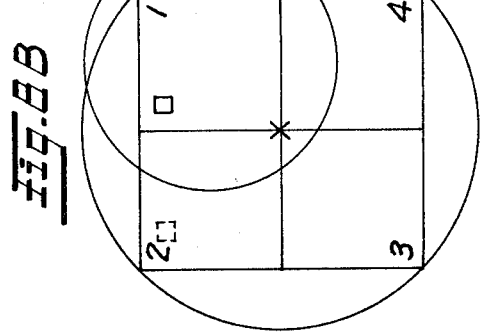
Figure 8A:
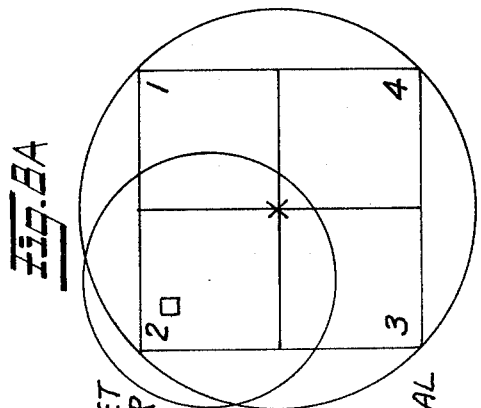

The semiconductor IC industry presently is employing from three-to-four inch diameter wafers and expects to go to five- and six-inch wafers in the future. Consequently, it is necessary to take this trend into account in providing an EBAL system. One method of exposing a five-inch semiconductor wafer with, for example, a three-inch diameter array optics lens, is to employ four successive 90 degree rotations of the wafer around a center as shown in FIGS. 8A of the drawings. FIG. 8A depicts the first exposure of a wafer in quadrant 2 followed by rotation of the wafer with the rotation center in the lower right quadrant of the optical column of the fly's eye electron beam tube whereby quadrants 1, 4 and 3 or alternatively for opposite direction of rotation quadrants 3, 4 and 1 would be successively exposed by 90 degree rotations of the wafer about the rotation center in the lower right quadrant of the optical column. A second or permuted exposure of the target wafer as discussed above can be achieved simply by physical displacement of the rotation center of the workpiece following the first set of exposures to a different physical location as illustrated in FIG. 8B wherein the center of rotation is physically displaced to the lower left quadrant of the optical column. FIG. 8C of the drawing discloses the second (permuted) exposure of the same target wafer in quadrant 2 after physical displacement of the center of the rotation to the lower left quadrant of the optical column pursuant to FIG. 8B.

In FIGS. 8A through 8C a three-inch optical column and a five-inch target wafer are drawn to scale and superimposed one over the other so as to illustrate the effect of a flawed lenslet whose field of view is depicted by a dotted-line small square appearing in FIG. 8B in the upper left corner of quadrant 2 of the semiconductor wafer. The flawed lenslet itself remains fixed in space and hence will appear as shown in FIGS. 8B and 8C after physical displacement of the center of rotation of the wafer. Subsequent rotation of the target wafer surface so that it then becomes under the electron optical column as in FIG. 8C, reveals that the dotted-line square or surface area portion of the wafer originally subjected to the field of view of the flawed lenslet now comes under the field of view of a working lenslet where it can be exposed by appropriate programming and control of both the system and individual station programming and control of both the system and individual station computer and control electronics as discussed hereinafter.

In order to stitch the field of view of each working lenslet used to expose an area previously under a flawed lenslet to the surrounding lenslet fields of view, an extended lenslet stitching calibration grid is used. This grid, which replaces the usual lenslet stitching calibration grid, has additional contiguous rows and columns of fiducial marks to achieve stitching after displacement of the semiconductor wafer or other target as described above.

FIG. 9A is a functional block diagram which illustrates schematically the construction of an EBAL station in a preferred configuration sharing spot selection, coarse deflection, pattern-dependent fine deflection, and pattern generating software and which employs a fly's eye electron beam column having an outer evacuated exposure station chamber 11 connected at each of the ends thereof to a suitable vacuum system for separately evacuating the end of the chamber in which an electron gun having a cathode 12 is mounted as well as the opposite end of the chamber in which the target semiconductor wafer to be processed is mounted. The electron gun shown generally by an electron cathode 12 is mounted at one end of station chamber 11 so as to project a finely focussed electron beam depicted by dash dot line 13 toward the opposite end of the electron-optical column on which a target workpiece, semiconductor wafer, or stitching calibration grid 14 is supported. The target workpiece or calibration grid 14 is supported within a target holder 15 which also supports a plurality of fiducial marking detector elements such as 16 that are disposed under the fiducial marking holes formed in the stitching calibration grid or chip registration grid 14 for stitching and registration purposes as described previously. For convenience of illustration only a single fiducial marking signal producing detector 16 has been illustrated which produces the required fiducial marking signals that are amplified by an amplifier 17 and supplied through a fiducial signal processor 18, both of conventional construction, back to an individual station computer 19 which carries out the data processing required for lenslet stitching and pattern registration. The target workpiece 14 and holder 15 together with fiducial signal producing element 16 are supported by a rotatable shaft 20 which passes through the wall of the vacuum chamber 11 by means of a rotating seal 21 which seal is mounted in a thin corrugated metal plate or bellows such that the rotating seal and shaft can be translated to the left or right the amount necessary to move the center of rotation of the workpiece in accordance with the above discussion and as illustrated in FIG. 8A and FIG. 8B. Shaft 20 is designed to be rotated by workpiece support rotation mechanism 22 of conventional construction with the rotation mechanism 22 and shaft 20 being physically translatable between one or two fixed positions at either end of the travel of the bellows seal 21A the construction of which is shown in FIGS. 9B and 9C by a workpiece stage translation mechanism 23. By this construction, the target rotation and translation mechanisms can be mounted exterior of the evacuated chamber 11 for physical rotation about the new center of rotation, as was described above with respect to FIGS. 8A through 8C. The wafer support rotation mechanism 22 which can comprise an electric motor of conventional construction suitably geared down to the rotational speeds required and the wafer support translation mechanism 23 which can comprise a linear electric motor, are under the control of a stage control 60 which in turn is under control of the system executive computer 24, which includes the pattern memory.

In operation the electron beam produced by the electron gun which includes cathode 12 first passes through a set of blanking electrodes 31 which are positioned to deflect the electron beam off of an aperture onto an opaque plate for cutting off or blanking the beam from reaching the target. After passing the blanking electrode 31, the beam passes through a beam spot selection optical system 32 for determining the the size and the shape of the electron beam spot, a beam steering deflector for aligning the electron beam with the axis of the coarse deflector 35 for deflecting the beam 13 to the entrance of a particular lenslet in the array of lenslets 36 and a stigmator for correcting astigmatism introduced by the fine deflector array 37 or for correcting for mechanical imperfections in the optical system which also can cause astigmatism. The lenslet array assembly is shown at 36 at the far end of the coarse deflector and is followed by the fine deflector assembly 37. The coarse deflector 35 may be of the type described in U.S. Pat. No. 4,142,132 by Kenneth J. Harte issued Feb. 27, 1979 and assigned to Control Data Corporation. The array lenslet assembly 36 and fine deflector assembly 37 may be of the type described in U.S. Pat. No. 4,200,794, by Sterling P. Newberry and J. R. Burgess, inventors, issued Apr. 29, 1980 and assigned to Control Data Corporation.

Figure 10B:
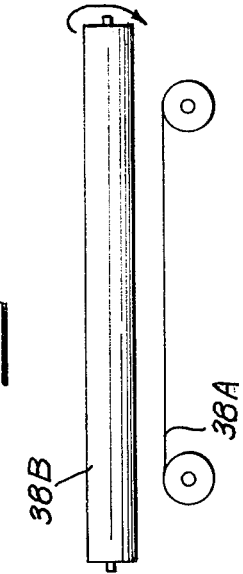
FIGS. 10A and 10B illustrate a suitable stepping aperture mechanism for controlling which lenslet or group of lenslets in the array is allowed to view the surface of the target wafer during exposure.
Figure 10A:
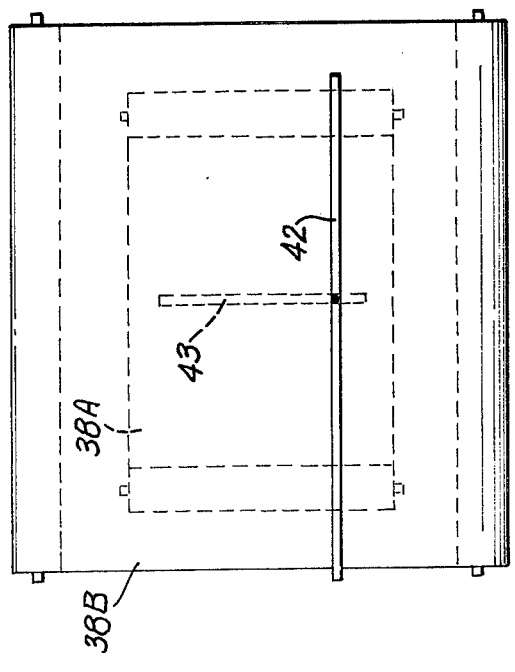

After passing through the array deflector assembly 37, the electron beam then must pass through a lenslet stopping aperture shown at 38 which is mechanically coupled through the connection indicated at 39 to a lenslet stopping aperture control 41. The construction of the lenslet stopping aperture is best seen in FIGS. 10A and 10B of the drawings. In FIG. 10B it will be seen that the lenslet stopping aperture comprises of two rolls of an electron stopping material rolled on calendar rolls that can be rolled either up or down or right and left as shown in FIG. 10A. The rolls of electron beam stopping material each have an elongated slit (42 or 43) formed therein and extending width-wise across the material. The slits 42 and 43 are so positioned as to intersect one another within their range of movement. From FIG. 10A it will be seen that at the point of intersection of the slits 42 and 43 in each roll of material, an opening exists through which the electron beam can pass to impinge upon a desired spot on the surface of the target wafer 14. This opening will normally be large enough to encompass one or more lenslets and the electron stopping material which forms the opening serves to prevent scattered electrons from reaching areas of the target other that that area immediately below the opening. The exact area of the opening must be determined by experiment and could range from one lenslet to many or may in some cases not be needed at all. In any event, the exact size and position of this opening need not be precise compared to the scale of the smallest features which are being written in the workpiece. In practice, the tolerances on the size and shape of this opening might typically be of the order of 10% or more of the dimensions of the lenslet field itself. Now consider the motion of the opening as the calendar rolls are activated. If, for example, the slit 43 is moved to the right, the opening will move to the right from the position shown in FIG. 10A and if it is moved left by appropriately rolling up one of the calendar rolls and paying out on the other, the opening will move to the left. Similarly, if the upper calendar roll is taken up and the lower calendar roll is payed out to control the positioning of the electron stopping material in which slit 42 is formed, the opening will move up from the position shown in FIG. 10A and if the calendar rolls are moved in the reverse direction, the opening can be caused to move downwardly. By this arrangement, the lenslet stopping aperture which is formed by the alignment of the two slit openings 42 and 43 at their intersection, can be caused to move in an X, Y plane over the entire surface of the target workpiece 14. The lenslet stopping aperture control 41 controls payout and takeup of the calendar rolls which control positioning of the opening defined by the slits 42 and 43 via the interconnection 39.

An EBAL optical column constructed as shown in FIG. 9A should employ a cathode which combines adequate brightness and low operating temperature with long life in a demountable vacuum chamber which is occasionally exposed to room air. Furthermore, the cathode should be designed for periodic replacement in demountable hardware. A possible cathode would be tungsten having a brightness of approximately $3 \times 10^4$ amperes per square centimeter per sterradian and an even better choice having higher brightness would be a lanthanum hexaboride which could operate the EBAL optics at a brightness of about $4 \times 10^5$ amperes per square centimeter per sterradian. Power for the cathode and electron gun would be from high voltage and cathode power supply 51 under the control of system executive computer 24. The beam blanker electrodes 31 are of conventional, known construction and are under the control of an electron beam blanker control 52 which is in turn controlled by the individual station computer 19. The beam spot size and shape selection optics 32 is of conventional known construction as described, for example, in the paper entitled "Electron Beam Direct Writing Lithography System" by J. Trotel, published in The Proceedings of the International Conference on Microlithography, Amsterdam, 30 Sept.–2 Oct. 1980, p. 111 (Delft University Press, 1981) and is under the control of electron beam spot selection control circuit 53 that in turn is controlled by the system executive computer 24. The beam steering deflector 33, which corrects for misalignment between the electron gun and the coarse deflector, is of conventional, known construction and is under the control of an electron beam steering control circuit 54 of conventional design and is in turn controlled by the individual station computer 19. The basic principles of the stigmator 34 and its associated stigmation control 55 are known to those skilled in the art and are under the control of both the system executive computer 24 and the individual station computer 19. The coarse deflector 35 and its associated coarse deflection control circuit 56, together with correction capability, are described more fully in the above referenced U.S. Pat. No. 4,142,132 to Kenneth J. Harte, and are in turn controlled by the system executive computer 24. The array lens assembly 36 is supplied with a constant focusing voltage from a high voltage power supply in 51 and a variable dynamic focusing voltage, as described more fully in U.S. patent application Ser. No. 116,895 filed Jan. 30, 1980, from the array lens dynamic focus control 57, which in turn is controlled by both the system executive computer 24 and the individual station computer 19. The fine deflector assembly 37 is controlled by the pattern-dependent fine deflection control 58, which in turn is controlled by the system executive computer 24, and corrected by the fine deflector correction 59, which in turn is controlled by the individual station computer 19.

As stated earlier, the system executive computer 24 may be common to all the EBAL stations comprising the EBAL System, each one of which is similar to that shown in FIG. 9A. In addition, the high voltage and cathode power supplies 51, the coarse deflection control 56, the pattern dependent fine deflection control 58, and the lenslet stopping aperture control 41 may be common to some or all of the EBAL stations under the control of the system executive computer 24. However, as explained above, it may be desirable to share spot selection control 53, coarse deflection control 56, pattern dependent fine deflection control 58, and pattern generating software only within subgroups of the electron optical columns comprising an EBAL system. FIGS. 11A and 11B show such a system, consisting of a number of EBAL stations such as is shown in FIG. 9A.

In FIGS. 11A and 11B, it is assumed that the system contains N stations which are divided into m subgroups of M stations each, and that these subgroups share a set of electronic control circuits 63 which include spot selection control 53, coarse deflection 56, lenslet stepping aperture control 41, pattern dependent fine deflection 58, flawed lenslet pattern memory 62, and a subgroup computer 64 in which some of the functions reside that were carried out by the system executive computer 24 in the system comprised of stations shown in FIG. 9A. Also from FIG. 11 it is seen that each station is provided with individual control circuits in the form of blanker control 52, beam steering control 54, stigmation control 55, array lens dynamic focus 57, fine deflection correction 59, a fiducial signal processor 18, and an individual station computer 19 within which are found circuits for stitching and registration and flawed lenslet mapping. Finally, a set of electronics 61 is associated with all N stations which include high voltage and cathode power supplies 51, stage control 60, complete pattern memory 65, and the system executive computer 24.

The system shown in FIGS. 11A and 11B is designed to handle the problem of flawed lenslets in accordance with the previous discussion of the theoretical data presented in FIGS. 7A and 7B. Referring first to FIG. 7A and assuming that in FIG. 11 the total number of stations N is equal to 36, then if the fraction of bad lenslets q is equal to 0.01 and the chip size is $8 \times 8 = 64$ lenslets, then by using one permute the chip yield is 99.4% but the relative thruput is reduced to 77%. However, if the 36 stations are grouped into 4 groups of 9, then the relative thruput increases to 92%, which is an increase in the thruput of $$\left( \frac{92 - 77}{77} \right) = 19\%.$$

The system shown in FIGS. 11A and 11B illustrates how the various electronics control circuits could be shared among the individual stations, the subgroups of stations, and the complete group of stations in order to implement the above considerations. In FIGS. 11A and 11B each station has a flawed lenslet mapping memory within the station computer 19, and the information from these memories is used to control the coarse deflection 56, the pattern dependent fine deflection 58, blanking 52, spot selection 54, stigmation 55, array lens dynamic focus 57, the lenslet stopping aperture control 41, and the flawed lenslet pattern memory 62 control circuits which are associated with each subgroup of M stations where, for example in the system under discussion, M = 9 and there are four subgroups for a total of 36 stations. Control of all of these circuits by the flawed lenslet mapping memory only occurs with the second or subsequent exposure. On the first exposure, all stations receive exactly the same pattern information from the complete pattern memory 65 during which time the flawed lenslet mapping memory is used to selectively blank the electron beam in those stations which have a flawed lenslet at the particular lenslet location which is currently being exposed. During the second exposure, the flawed lenslet mapping memory is used to control the exposure of only flawed lenslets. In order to allow this second exposure to proceed simultaneously among all of the subgroups of M stations flawed lenslets pattern memories 62 have been provided. These pattern memories contain only that part of the information contained in the complete pattern memory which is associated with flawed lenslets. The size of the flawed lenslet pattern memory will be equal to a fraction Mq of the complete pattern memory, which in the present example would be $9 \times 1\% = 9\%$ of the complete pattern.

From the foregoing description it will be appreciated that the invention provides a new and improved EBAL system particularly designed for use in the fabrication of semiconductor integrated circuits of the LSI and VLSI type either in the form of reticles, masks or directly written patterns on wafers. The EBAL system employs an electron beam electron optical column of the fly's eye type wherein an array lenslet assembly is employed in conjunction with an associated array deflector assembly to provide precise and extremely fine detailed control over the positioning of the electron beam with respect to the surface of a workpiece during exposure with the electron beam. The system is designed such that while the field of view of each lenslet in the array optical system employed in the fly's eye electron beam column is not large enough to cover a complete circuit pattern, the fields of view of a number of adjacent lenslets can be stitched together at the workpiece surface so as to cover the entire surface. Electron beam registration between adjacent lenslets and between successive superimposed levels of materials deposited or otherwise formed on the surface of the target workpieces is achieved through the use of a novel registration scheme employing fiducial marking signals derived from the surface of the target wafer. The effect of any flawed lenslets in the array optics are overcome through the use of a novel permutation scheme in which areas on the target workpiece surface that otherwise would be affected by a flawed lenslet are rewritten so as to greatly increase the yield of IC circuits produced by the EBAL method and system.

Having described one embodiment of an improved method and system for electron beam array lithography according to the invention, it is believed that other modifications, variations and additions to the system and method will become obvious to those skilled in the art in the light of the above teachings. It is, therefore, to be understood that all such obvious variations, changes and additions are considered to come within the scope of the invention as defined by the appended claims.

What is claimed is:

1. The method of operating an electron beam array lithography system employing an electron beam column of the array optics type having an array lenslet assembly, an array fine deflector assembly and a coarse deflector assembly for selectively directing an electron beam to a desired element of the array of lenslets and its associated fine deflector element which directs the electron beam to a desired point on a target surface; the method comprising fabricating a lenslet stitching calibration grid having formed thereon a grid-like network of fiducial marking elements, using said calibration grid to derive fiducial marking signals indicative of the boundaries of the field of view of the individual elements of array lenslet assembly, using said fiducial marking signals to control the electron beam column so as to stitch together the individual fields of view of the elements in the array lenslet assembly in order to cover a desired area of a target workpiece to be exposed to the electron beam and which is greater in surface area than the area covered by the field of view of an individual array lenslet element, and correcting for height displacement differences due to difference between vertical placement of the lenslet stitching calibration grid and the target surface along the electron beam path axis within the array optic electron beam column.

2. The method of operating an electron beam array lithography system employing an electron beam column of the array optics type having an array lenslet assembly, an array fine deflector assembly and a coarse deflector assembly for selectively directing an electron beam to a desired element of the array of lenslets and its associated fine deflector element which directs the electron beam to a desired point on a target surface; the method comprising fabricating a lenslet stitching calibration grid having formed thereon a grid-like network of fiducial marking elements, using said calibration grid to derive fiducial marking signals indicative of the boundaries of the field of view of the individual elements of array lenslet assembly, using said fiducial marking signals to control the electron beam column so as to stitch together the individual fields of view of the elements in the array lenslet assembly in order to cover a desired area of a target workpiece to be exposed to the electron beam and which is greater in surface area than the area covered by the field of view of an individual array lenslet element, said lenslet stitching calibration grid being fabricated by transformation from a mathematical grid which is congruent to all lenslets in the array lenslet assembly and defined by normalized coordinates $x_0$, $y_0$ such that the corners of the field of view of each lenslet area are at $x_0 = \pm 1$, $y_0 = \pm 1$, mapping the mathematical grid into the lenslet stitching calibration grid with a sufficient number of nonlinear voltage terms such that the lines connecting the corners of the mathematical grid and which define the boundaries between the field of view of the lenslets in mathematical space are mapped into corresponding boundary lines on the lenslet stitching calibration grid and which are sufficiently close together so as to be within an acceptable range of stitching error, the lenslet stitching calibration grid being defined and accessed by real voltages $V_x(x_0,y_0)$ and $V_y(x_0,y_0)$ with the corners of the stitching calibration grid being determined by the actual physical locations of the fiducial marks formed in the calibration grid at the corners of the field of view of the respective lenslets, the position of interior points within the calibration grid relative to the corners being determined by the nonlinear relation between the deflection voltage and electron beam spot position at the target plane, the deviations from perfection in the construction of the array optical system and the form of the equations used to map ideal voltages from the ideal mathematical grid into the real voltages required to access the lenslet stitching calibration grid, said lenslet stitching calibration grid having formed thereon fiducial marking elements corresponding to at least the corners of the fields of view of each lenslet element of the array lenslet assembly and wherein the target workpiece is a semiconductor chip onto which an integrated circuit design is to be formed employing electron beam lithography; said method further comprising forming fiducial marking elements at a plurality of points on the border of each chip to thereby form a chip registration grid, measuring the x-y coordinate positions of the chip registration grid fiducial elements for mapping purposes, and transforming the chip registration grid mapped coordinate positions into corresponding positions on the lenslet stitching calibration grid by means of which patterns are actually written on the chip with the electron beam column of the array optics type whereby chip by chip corrections can be made for semiconductor wafer insertion errors due to translation or rotation and for wafer dimensional changes due to expansion or quadrilateral distortion, one form of mapping equation for transforming the mathematical grid into the lenslet stitching calibration grid is given by:

$$V_x = \overline{V}_x[C_{00} + (1 + C_{10})x_0 + C_{01}0 + C_{11}x_0y_0 + (g_{10}x_0^2 + g_{01}v_0^2)x_0] \quad (1)$$

$$V_y = \overline{V}_y[D_{00} + (1 + D_{01})y_0 + D_{10}x_0 + D_{11}x_0 0 + (h_{10}x_0^2 + h_{01}v_0^2)y_0] \quad (2)$$

and where C and D are coefficients determined for each lenslet by measuring the voltages $V_x$ and $V_y$ which place the electron beam at the positions of the lenslet stitching calibration grid fiducial marks; the values of $x_0$ and $y_0$ are as $(1,1), (1,-1), (-1,-1)$ and $(-1,1)$ at the fiducial marks corresponding to the corresponding mathematical grid corners; the g and h coefficients are coefficients for nonlinear pincushion distortion ($g_{01}$ and $h_{10}$) and nonlinear gain ($g_{10}$ and $h_{01}$) and are determined by computer simulation of the properties of the array optical fine deflector; the constants $\overline{V}_x$ and $\overline{V}_y$ are the nominal full-field deflection voltages which are determined empirically or by computer simulation; the constants C and D are determined from equations (1) and (2) using the measured values of $V_x$ and $V_y$ at the four corners of the stitching calibration grid, the assumed values of $x_0$ and $y_0$ and the calculated values of g and h; and wherein the constants represent the topological effects of Displacement ($C_{00}$, $D_{00}$), Rotation ($C_{01}$, $D_{10}$) Expansion ($C_{10}$, $D_{01}$) and Quadrilateral Distortion ($C_{11}$, $D_{11}$), the chip registration grid being defined by chip centered coordinates X,Y such that the corners of the chip registration grid are at $X=\pm(1+I_{max})$ and $Y=\pm(1+J_{max})$ and I and J are indices that locate the field of view of a lenslet within a chip and wherein from one lenslet to the next the indices increment by 2 units reaching values of $\pm I_{max}$ and $\pm J_{max}$ at the edges of the chip, transformation of the chip registration grid mapped coordinate positions to the lenslet stitching registration grid being achieved by first transforming the chip registration grid described by the X,Y coordinate system into the mathematical grid described by the ideal coordinate system with the variables X, Y being the same ideal hypothetical form as the mathematical grid variable $x_0$, $y_0$ but defined over a chip covered by the field of view of a multiplicity of lenslets; the mapping equation for transforming the chip registration grid into the mathematical grid being given by the bilinear transformation:

$$x_0 = E_{00} - I + (1+E_{10})X + E_{01}Y + E_{11}XY \quad (3)$$

$$y_0 = F_{00} - J + (1+F_{01})Y + F_{10}X + F_{11}XY \quad (4)$$

where the E and F constants describe the same topological effects as the corresponding terms C and D described in equations (1) and (2), but on a chip rather than a lenslet level; the E and F terms are determined by first finding the values of $x_0$ and $y_0$ using equations (1) and (2) after first measuring $V_x$ and $V_y$ required to deflect the electron beam to the chip registration fiducial marks and using the values of C and D previously determined; and inserting the values of $x_0$ and $y_0$ and the appropriate values of X, Y, I and J into equations (3) and (4) to thereby ascertain the value of the E and F terms; specifying the values of X and Y as linear orthogonal coordinates which describe the pattern to be created by the electron beam accessed lithography system on the surface of a semiconductor chip; determining the required deflection voltages which must be applied to the fine deflection system by first finding the values of I and J where:

$$X = x + I \quad (5)$$

$$Y = y + J \quad (6)$$

such that $-1 < X < 1$ and $-1 < y \leq 1$; thereafter inserting the values of X, Y, I and J into equations (3) and (4) to determine the values of $x_0$ and $y_0$; and inserting the values of $x_0$ and $y_0$ into equations (1) and (2) to determine the actual deflection voltages $V_x$ and $V_y$, and correcting for height displacement differences due to difference between vertical placement of the lenslet stitching calibration grid and the target surface along the electron beam path axis within the array optic electron beam column.

3. The method according to claim 1 wherein the vertical placement of the lenslet stitching calibration grid and the target surface are separated by a distance $\delta h$ where the plane containing the lenslet stitching calibration grid is defined as the x plane and the target surface plane as the x' plane, then distances in the x' plane are related to distances in the x plane by the expressions $x' = x(1+\delta h/h)$ where h is the distance from the x plane to the center of the deflection.

4. The method according to claim 2 wherein the vertical placement of the lenslet stitching calibration grid and the target surface are separated by a distance $\delta h$ where the plane containing the lenslet stitching calibration grid is defined as the x plane and the target surface plane as the x' plane, the distances on the x' plane are related to distances in the x plane by the expressions $x' = (1+\delta h/h)$ where h is the distance from the x plane to the center of deflection.

5. The method according to claim 3 wherein $\delta h$ is measured by the electron beam in the array optics column by using the method of triangulation leading to the equation $$\frac{\delta h}{h} = \frac{\Delta_0 + \Delta_1}{2 - (\Delta_0 + \Delta_1)}$$

where $\Delta_o$ and $\Delta_1$ are the displacement distance differences between the apparent position of a chip fiducial mark and its true position caused by the vertical displacement differences between x and x' planes.

6. The method according to claim 4 wherein $\delta h$ is measured by the electron beam in the array optics column by using the method of triangulation leading to the equation $$\frac{\delta h}{h} = \frac{\Delta_0 + \Delta_1}{2 - (\Delta_0 + \Delta_1)}$$

where $\Delta_o$ and $\Delta_1$ are the displacement distance differences between the apparent position of a chip fiducial mark and its true position caused by the vertical displacement differences between x and x' planes.

7. The method of operating an electron beam array lithography system employing an electron beam column of the array optics type having an array lenslet assembly, an array fine deflector assembly and a coarse deflector assembly for selectively directing an electron beam to a desired element of the array of lenslets and its associated fine deflector element which directs the electron beam to a desired point on a target surface; the method comprising fabricating a lenslet stitching calibration grid having formed thereon a grid-like network of fiducial marking elements, using said calibration grid to derive fiducial marking signals indicative of the boundaries of the field of view of the individual elements of array lenslet assembly, using said fiducial marking signals to control the electron beam column so as to stitch together the individual fields of view of the elements in the array lenslet assembly in order to cover a desired area of a target workpiece to be exposed to the electron beam and which is greater in surface area than the area covered by the field of view of an individual array lenslet element, and wherein the target workpiece is a semiconductor chip onto which an integrated circuit design is to be formed employing electron beam lithography, said method further comprising forming fiducial marking elements at at least a plurality of points on the border of each chip to thereby form a chip registration grid, measuring the x-y coordinate positions of the chip registration grid fiducial elements for mapping purposes, and transforming the chip registration grid mapped coordinate positions into corresponding positions on the lenslet stitching calibration grid by means of which patterns are actually written on the chip with the electron beam column of the array optics type whereby chip by chip corrections can be made for semiconductor wafer insertion errors due to translation or rotation and for wafer dimensional changes due to expansion or quadrilateral distortion; and said method being employed in conjunction with an array lenslet assembly one or more of which may be flawed and further including deriving fiducial marking signals from a chip registration grid formed on or near the target surface for identifying the boundaries of the field of view of the respective array of lenslets on the target surface for use in stitching together the combined fields of view of a plurality of the array of lenslets sufficient to cover a desired area of the target surface to be exposed, exposing the desired area of the surface to the electron beam, mapping in a computer memory the location of any spot on the exposed area which was subject to the field of view of a flawed lenslet in the array lenslet assembly while blanking operation of the flawed lenslet, permuting the physical position of the exposed target area to a new physical position subject to the field of view of a different set of array lenslets whose combined field of view again covers the desired area of the target surface to be exposed, deriving from the computer memory retrace control signals for controlling operation of at least the coarse deflector and fine deflector assembly of the electron beam tube for redirecting the electron beam back to the previously unexposed spot caused by the flawed lenslet, and retracing the electron beam over such spot in accordance with the master pattern specifications for the spot location on the target surface whereby increased yield from the EBAL system is obtained.

8. The method according to claim 7 further comprising employing fiducial marking signals derived from a chip registration grid for controlling reregistration of the target surface after removal, partial processing and reinsertion of the target surface in the same or a different EBAL station by automatically controlling the position of the electron beam at the target surface with the fiducial marking signals relative to the array lenslets and fine deflector assembly to correct for rotation, expansion, linear displacement, and other similar target insertion errors as well as target warping or dimensional changes due to intermediary processing of the target, thermal expansion, expansion gradients, differential expansion between the array lenslet assembly and the target and other like errors in positioning of the target surface after its removal, partial processing and reinsertion in the same or a different EBAL station.

9. The method according to claim 8 wherein permutation of the target surface is achieved in the same electron beam tube in which initial exposure of the target surface occurred by translation of the center of rotation to a new location and rotation of the target surface about the new center of rotation.

10. The method according to claim 9 further comprising employing the fiducial marking signals derived from the chip registration grid for controlling reregistration of the target surface after removal, partial processing and reinsertion of the target surface in the same or a different EBAL station or after permutation by automatically controlling positioning of the target surface with the fiducial marking signals relative to the array lenslets and fine deflector assembly to correct for rotation, expansion, linear displacement, and other similar target insertion errors as well as target warping or dimensional changes due to intermediary processing of the target, thermal expansion, expansion gradients, differential expansion between the array lenslet assembly and the target and other like errors in positioning of the target surface after its removal, partial processing and reinsertion in the same or a different EBAL station.

11. The method according to claim 8 wherein the method is conducted simultaneously in a plurality of parallel operated EBAL stations.

12. The method according to claim 11 wherein the method is conducted simultaneously in corresponding lenslets within subgroups of parallel operated EBAL stations which together form a larger group of EBAL stations.

13. The method according to claim 11 or 12 wherein each EBAL station comprising a separate electron beam tube has the characteristics recited in claim 1 and has a high voltage power and electron gun power supply, a pattern position dependent dynamic focus, stigmation, deflection, blanking and electron beam spot size selection controlled in common by an overall system computer and chip registration, lenslet stitching, rotational and translational movement control, flawed lenslet mapping memory and control and coarse deflection for flawed lenslet mapping memory and control and coarse deflection for flawed lenslet correction memory and control all individually controlled for each station by an individual station computer either alone or in conjunction with the system computer.

14. The method according to claim 11 further including correcting for height displacement differences due to difference between vertical placement of the lenslet stitching calibration grid and the target surface along the electron beam path axis within the array optic electron beam column.

15. The method according to claim 7 further including correcting for height displacement differences due to difference between vertical placement of the lenslet stitching calibration grid and the target surface along the electron beam path axis within the array optic electron beam column.

16. The method according to claim 6 employed in conjunction with an array lenslet assembly one or more of which may be flawed and further including deriving fiducial marking signals from an extended lenslet stitching grid formed on or near the target surface for identifying the boundaries of the field of view of the respective array of lenslets on the target surface for use in stitching together the combined fields of view of a plurality of the array of lenslets sufficient to cover a desired area of the target surface to be exposed, exposing the desired area of the surface to the electron beam, mapping in a computer memory the location of any spot on the exposed area which was subject to the field of view of a flawed lenslet in the array lenslet assembly while blanking operation of the flawed lenslet, permuting the physical position of the exposed target area to a new physical position subject to the field of view of a different set of array lenslets whose combined field of view again covers the desired area of the target surface to be exposed, deriving from the computer memory retrace control signals for controlling operation of at least the coarse deflector and fine deflector assembly of the electron beam tube for redirecting the electron beam back to the previously unexposed spot caused by the flawed lenslet, and retracing the electron beam over such spot in accordance with the master pattern specifications for the spot location on the target surface whereby increased yield from the EBAL system is obtained.

17. The method according to claim 16 further comprising employing the fiducial marking signals derived from the chip registration grid for controlling reregistration of the target surface after removal, partial processing and reinsertion of the target surface in the same or a different EBAL station by automatically controlling positioning of the target surface with the fiducial marking signals relative to the array lenslets and fine deflector assembly to correct for rotation, expansion, linear displacement, and other similar target insertion errors as well as target warping or dimensional changes due to intermediary processing of the target, thermal expansion, expansion gradients, differential expansion between the array lenslet assembly and the target and other like errors in positioning of the target surface after its removal, partial processing and reinsertion in the same or a different EBAL station.

18. The method according to claim 17 wherein permutation of the target surface is achieved in the same electron beam tube in which initial exposure of the target surface occurred followed by a linear translation of the target surface to a new location.

19. The method according to claim 18 further comprising employing the fiducial marking signals derived from the chip registration grid for controlling reregistration of the target surface after removal, partial processing and reinsertion of the target surface in the same or a different EBAL station or after permutation by automatically controlling positioning of the target surface with the fiducial marking signals relative to the array lenslets and fine deflector assembly to correct for rotation, expansion, linear displacement, and other similar target insertion errors as well as target warping or dimensional changes due to intermediary processing of the target, thermal expansion, expansion gradients, differential expansion between the array lenslet assembly and the target and other like errors in positioning of the target surface after its removal, partial processing and reinsertion in the same or a different EBAL station.

20. The method according to claim 19 wherein the method is conducted simultaneously in a plurality of parallel operated EBAL stations with each EBAL station comprising a separate electron beam tube having the characteristics recited in claim 1 and having a high voltage power and electron gun power supply, pattern position dependent dynamic focus, stigmation, deflection, blanking and electron beam spot size selection are controlled in common by an overall system computer and chip registration, lenslet stitching rotational and translational movement control, flawed lenslet mapping memory and control and coarse deflection for flawed lenslet mapping memory and control and coarse deflection for flawed lenslet correction memory and control all individually controlled for each station by an individual station computer either alone or in conjunction with the system computer.

21. An EBAL system employing an electron beam tube of the fly's eye type having an array lenslet assembly and associated fine deflector assembly together with a coarse deflector for selectively directing an electron beam to a desired one of the array lenslets and its associated fine deflector, one or more of which may be flawed, for performing electron beam lithography, said EBAL system including means for selectively permuting a target surface on which the electron beam impinges during successive exposures of the target surface to the electron beam whereby the effect of a flawed lenslet in the lenslet array can be overcome by transposition of the area of the target surface previously under the field of view of a flawed lenslet to a new location where it is subject to the field of view of a working lenslet, fiducial marking signal producing means for producing fiducial marking signals for use in stitching together the boundary of the field of view of adjacent lenslets on the traget surface and for reregistration of the target surface after permutation between the same or different electron beam exposure stations and mapping memory means for mapping the location of areas on the target surface which are subject to the field of view of a flawed lenslet and storing the location of flawed lenslet subjected areas of the target surface for subsequent readout and use with the fiducial marking signals for controlling operation of the electron beam following permutation of the target surface to a new location where the flawed lenslet subjected areas are subject to the field of view of a working lenslet.

22. An EBAL stystem according to claim 21 wherein said electron beam tube of the fly's eye type further includes an electron gun power supply connected to and supplying an electron gun disposed within the tube, electron beam blanking electrodes supplied by an electron beam blanker control for blanking the electron beam prior to its passage through the tube, an electron beam spot size selection optical system under the control of an electron beam spot size selection control for controlling the cross-sectional dimensions of the electron beam used to perform electron beam lithography, an electron beam stepping deflector assembly under the control of an electron beam stepping control, a stigmator under the control of a stigmation control and a coarse deflection control connected to and controlling operation of the coarse deflector; said fly's eye type electron beam tube further including an array lenslet focus control connected to and controlling excitation of the lenslet array, a fine deflection control connected to and controlling excitation of the fine deflection assembly for controlling fine deflection of the electron beam after passage through a selected one of the array lenslets, a fine deflection correction control, and a fiducial signal processor circuit for amplifying and shaping the fiducial marking signals; said EBAL system further including a system computer and an individual station computer for controlling operation of the above-listed control components of the fly's eye type electron beam tube in conjunction with preprogrammed lithography processing steps and patterns and the output fiducial marking signals supplied thereto from the fiducial signal processor.

23. An EBAL system according to claim 21 wherein said means for selectively permuting a target surface on which the electron beam impinges within the electron beam tube comprises means for rotating the target surface relative to the electron beam tube, means for physically translating the center of rotation of the target surface to a new location different from the first center of rotation and means for rotating the target surface about the new center of rotation.

24. An EBAL system according to claim 22 wherein said means for selectively permuting a target surface on which the electron beam impinges within the electron beam tube comprises means for rotating the target surface relative to the electron beam tube, means for physically translating the center of rotation of the target surface to a new location different from the first center of rotation and means for rotating the target surface about the new center of rotation.

25. An EBAL system according to either of claims 21–23 wherein the target surface is the surface of a semiconductor wafer that comprises the base member on which a plurality of semiconductor integrated circuit chips are to be formed by electron beam lithography and intermediary processing steps whereby the semiconductor wafer is processed in successive stages applied between each removal and reinsertion of the semiconductor wafer within the same or a different electron beam tube.

26. An EBAL system according to claim 24 wherein the target surface is the surface of a semiconductor wafer that comprises the base member on which a plurality of semiconductor integrated circuit chips are to be formed by electron beam lithography and intermediary processing steps whereby the semiconductor wafer is processed in successive stages applied between each removal and reinsertion of the semiconductor wafer within the same or a different electron beam tube.

27. An EBAL system according to claim 21 wherein there are a plurality of parallel operated fly's eye electron beam tubes having the characteristics recited in claim 21 and further including a system computer for controlling the operation of certain components of all of the fly's eye beam tubes in common and a plurality of individual station computers each respectively associated with an individual fly's eye electron beam tube for controlling the operation of the remaining components of its respective electron beam tube alone or in conjunction with the system computer.

28. An EBAL system according to claim 26 wherein there are a plurality of parallel operated EBAL stations with each EBAL station comprising a separate electron beam tube having the characteristics recited in claim 22 and wherein the high voltage power and electron gun power supply, the pattern position dependent dynamic focus, stigmation, deflection, blanking and electron beam spot size selection are controlled in common for all the EBAL stations by said common system computer which is connected to control all of the electron beam tubes in parallel; and the chip registration, lenslet stitching, rotation and translational movement control, flawed lenslet mapping and control and coarse deflection for the flawed lenslet correction memory and control all are individually controlled for each station by its respective individual station computer alone or in conjunction with the system computer.

29. The method of operating an electron beam accessed lithography (EBAL) system of the type employing an electron beam tube of the fly's eye type having an array lenslet assembly, a fine deflector assembly and a coarse deflector for selectively and sequentially directing an electron beam to a desired one of the array of lenslets and its associated deflector, one or more of which may be flawed, for performing electron beam lithography on a target surface; said method comprising deriving fiducial marking signals from a chip registration grid formed on or near the target surface for identifying the boundaries of the field of view of the respective lenslets on the target surface for use in stitching together the combined fields of view of a plurality of lenslets sufficient to cover a desired area of the target surface to be exposed, exposing the desired area of the surface to the electron beam, mapping in a computer memory the location of any spot on the exposed area which was subject to the field of view of a flawed lenslet in the array lenslet assemby while blanking operation of the flawed lenslet, permuting the physical position of the exposed target area to a new physical position subject to the field of view of a different set of array lenslets whose combined field of view again covers the desired area of the target surface to be exposed, deriving from the computer memory retrace control signals for controlling operation of at least the coarse deflector and fine deflector assembly of the electron beam tube for redirecting the electron beam back to the previously unexposed spot caused by the flawed lenslet, and retracing the electron beam over such spot in accordance with the master pattern specifications for the spot location on the target surface whereby increased yield from the EBAL system is obtained.

30. The method according to claim 29 further comprising employing the fiducial marking signals derived from the chip registration grid for controlling reregistration of the target surface after removal, partial processing and reinsertion of the target surface in the same or a different EBAL station by automatically controlling positioning of the target surface with the fiducial marking signals relative to the array lenslets and fine deflector assembly to correct for rotation, expansion, linear displacement, and other similar target insertion errors as well as target warping or dimensional changes due to intermediary processing of the target, thermal expansion, expansion gradients, differential expansion between the array lenslet assembly and the target and other like errors in positioning of the target surface after its removal, partial processing and reinsertion in the same or a different EBAL station.

31. The method according to claim 29 wherein permutation of the target surface is achieved in the same electron beam tube in which initial exposure of the target surface occurred followed by linear translation of the target surface to a new location.

32. The method according to claim 30 wherein permutation of the target surface is achieved in the same electron beam tube in which initial exposure of the target surface occurred followed by translation of the center of rotation to a new location and rotation of the target surface about the new center of rotation.

33. The method according to claim 32 further comprising employing the fiducial marking signals derived from the chip registration grid for controlling reregistration of the target surface after removal, partial processing and reinsertion of the target surface in the same or a different EBAL station or after permutation by automatically controlling positioning of the target surface with the fiducial marking signals relative to the array lenslets and fine deflector assembly to correct for rotation, expansion, linear displacement, and other similar target insertion errors as well as target warping or dimensional changes due to intermediary processing of the target, thermal expansion, expansion gradients, differential expansion between the array lenslet assembly and the target and other like errors in positioning of the target surface after its removal, partial processing and reinsertion in the same or a different EBAL station.

34. The method according to any of claims 29-33 wherein the target surface is the surface of a semiconductor wafer that comprises the base member on which a plurality of semiconductor integrated circuit chips are to be formed by electron beam lithography and intermediary processing steps whereby the wafer is processed in successive stages applied between each removal and reinsertion of the wafer in the electron beam tube for selective exposure to the electron beam.

35. The method according to any of claims 29-33 wherein the method is conducted simultaneously in a plurality of parallel operated EBAL stations with each EBAL station comprising a separate electron beam tube having the characteristics recited in claim 34 and wherein the high voltage power and electron gun power supply, the pattern position dependent dynamic focus, stigmation, deflection, blanking and electron beam spot size selection are controlled in common by an overall system computer and the chip registration, lenslet stitching, rotational and translational movement control, flawed lenslet mapping memory and control and coarse deflection for flawed lenslet correction memory and control all are individually controlled for each station by an individual station computer either alone or in conjunction with the system computer.

* * * * *